United States Patent
Negoro et al.

(10) Patent No.: US 11,670,517 B2
(45) Date of Patent: Jun. 6, 2023

(54) SUBSTRATE PROCESSING METHOD AND SUBSTRATE PROCESSING DEVICE

(71) Applicant: SCREEN Holdings Co., Ltd., Kyoto (JP)

(72) Inventors: Sei Negoro, Kyoto (JP); Kenji Kobayashi, Kyoto (JP)

(73) Assignee: SCREEN Holdings Co., Ltd.

( * ) Notice: Subject to any disclaimer, the term of this patent is extended or adjusted under 35 U.S.C. 154(b) by 10 days.

(21) Appl. No.: 17/262,807

(22) PCT Filed: Jul. 4, 2019

(86) PCT No.: PCT/JP2019/026609
§ 371 (c)(1),
(2) Date: Jan. 25, 2021

(87) PCT Pub. No.: WO2020/044789
PCT Pub. Date: Mar. 5, 2020

(65) Prior Publication Data
US 2021/0313191 A1    Oct. 7, 2021

(30) Foreign Application Priority Data

Aug. 31, 2018  (JP) .............................. JP2018-163796
Apr. 11, 2019  (JP) .............................. JP2019-075345

(51) Int. Cl.
| | | |
|---|---|---|
| *H01L 21/3213* | (2006.01) | |
| *H01L 21/02* | (2006.01) | |
| *H01L 21/3205* | (2006.01) | |
| *H01L 21/67* | (2006.01) | |
| *H01L 21/687* | (2006.01) | |

(52) U.S. Cl.
CPC .. *H01L 21/32134* (2013.01); *H01L 21/02052* (2013.01); *H01L 21/32055* (2013.01); *H01L 21/67023* (2013.01); *H01L 21/68764* (2013.01)

(58) Field of Classification Search
None
See application file for complete search history.

(56) References Cited

U.S. PATENT DOCUMENTS

| | | | |
|---|---|---|---|
| 2008/0111175 A1* | 5/2008 | Cheng ............... | H01L 21/32134 438/746 |
| 2010/0126961 A1 | 5/2010 | Kim et al. ...................... | 216/38 |
| 2013/0203263 A1 | 8/2013 | Shimada et al. .............. | 438/753 |
| 2013/0306238 A1 | 11/2013 | Miura et al. .............. | 156/345.11 |

(Continued)

FOREIGN PATENT DOCUMENTS

| | | |
|---|---|---|
| JP | 2006-005261 A | 1/2006 |
| JP | 2008-277715 A | 11/2008 |

(Continued)

OTHER PUBLICATIONS

International Preliminary Report on Patentability (Chapter I of the Patent Cooperation Treaty) dated Mar. 11, 2021 with a Notification from the International Bureau (Form PCT/IB/326) in corresponding PCT International Application No. PCT/JP2019/026609 in Japanese.

(Continued)

*Primary Examiner* — Shamim Ahmed
(74) *Attorney, Agent, or Firm* — Ostrolenk Faber LLP

(57) ABSTRACT

An alkaline etchant containing a quaternary ammonium hydroxide, water, and an inhibitory substance for inhibiting contact between hydroxide ions generated from the quaternary ammonium hydroxide and objects P1 to P3 to be etched is prepared. The prepared etchant is supplied to a substrate in which the polysilicon-containing objects P1 to P3 to be etched and objects O1 to O3 not to be etched, which are different from the objects P1 to P3 to be etched, are exposed, thereby etching the objects P1 to P3 to be etched while preventing the objects O1 to O3 not to be etched from being etched.

10 Claims, 10 Drawing Sheets

(56) References Cited

U.S. PATENT DOCUMENTS

| | | | | |
|---|---|---|---|---|
| 2014/0001145 | A1 | 1/2014 | Mizutani et al. | 216/6 |
| 2016/0181112 | A1* | 6/2016 | Xue | H01J 37/32357 |
| | | | | 438/705 |
| 2016/0218012 | A1* | 7/2016 | Shimamoto | H01L 21/3065 |
| 2017/0145311 | A1* | 5/2017 | Liu | H01L 21/30608 |
| 2017/0294323 | A1* | 10/2017 | Miura | B01F 23/2323 |
| 2018/0171226 | A1* | 6/2018 | Yang | C09K 13/00 |
| 2020/0248075 | A1* | 8/2020 | Kneer | C09K 13/00 |

FOREIGN PATENT DOCUMENTS

| | | |
|---|---|---|
| JP | 2012-199521 A | 10/2012 |
| JP | 2013-251459 A | 12/2013 |
| JP | 2013-258391 A | 12/2013 |
| KR | 10-2018-0083375 A | 7/2018 |
| WO | WO 2012/029450 A1 | 3/2012 |
| WO | WO 2017/083811 A1 | 5/2017 |

OTHER PUBLICATIONS

English translation of the International Preliminary Report on Patentability (Chapter I of the Patent Cooperation Treaty) dated Mar. 11, 2021 with a Notification from the International Bureau (Form PCT/IB/338) in corresponding PCT International Application No. PCT/JP2019/026609 in English.

International Search Report dated Aug. 27, 2019 in corresponding PCT International Application No. PCT/JP2019/026609.

Written Opinion dated Aug. 27, 2019 in corresponding PCT International Application No. PCT/JP2019/026609.

\* cited by examiner

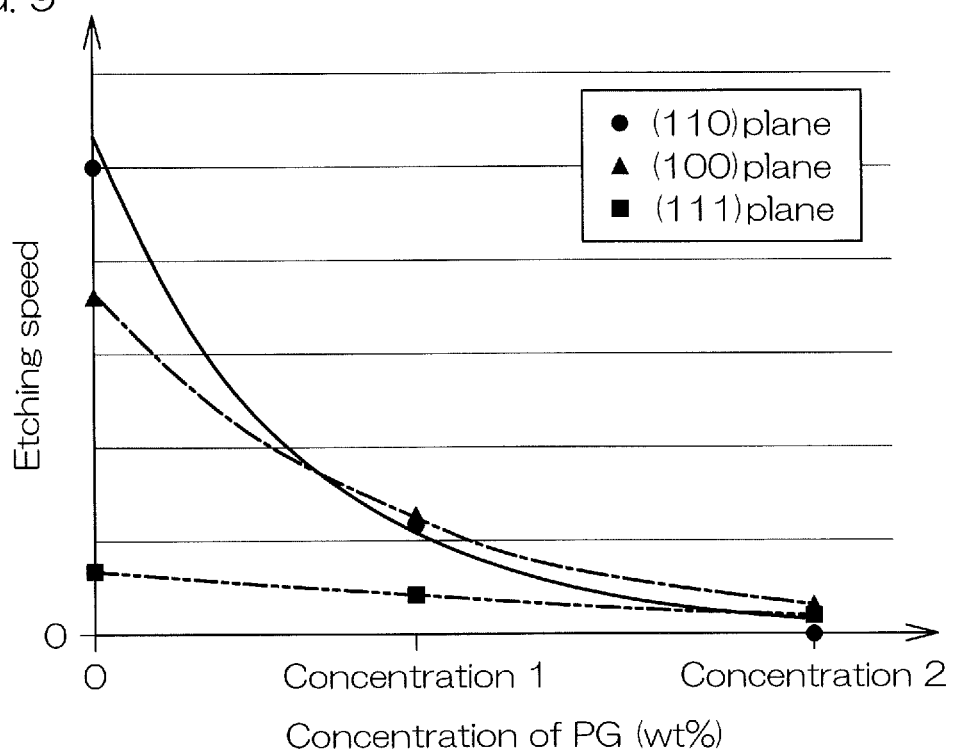

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of International Application No. PCT/JP2019/026609, filed Jul. 4, 2019, which claims priority to Japanese Patent Application No. 2018-163796, filed Aug. 31, 2018, and Japanese Patent Application No. 2019-075345, filed Apr. 11, 2019, the entire contents of these applications are hereby incorporated herein by reference. The PCT International Application was published in the Japanese language.

TECHNICAL FIELD

The present invention relates to a substrate processing method and a substrate processing apparatus that each processes a substrate. Examples of substrate include a semiconductor wafer, a substrate fora flat panel display (FPD) such as a liquid crystal display and an organic electroluminescence (organic EL) display, a substrate for an optical disc, a substrate for a magnetic disk, a substrate for a magneto-optical disc, a substrate fora photomask, a ceramic substrate, a substrate for a solar cell, and the like.

BACKGROUND ART

Ina manufacturing process of a semiconductor device, a liquid crystal display, etc., a substrate processing apparatus is used which processes a substrate such as a semiconductor wafer or a glass substrate fora liquid crystal display. Patent Literature 1 discloses a substrate processing apparatus that supplies TMAH to the substrate and etches a polysilicon film formed on the substrate.

CITATION LIST

Patent Literature

Patent Literature 1: JP 2013-258391 A

SUMMARY OF INVENTION

Technical Problem

In a manufacturing process of a semiconductor device, a liquid crystal display, etc., an etching liquid such as TMAH may be supplied to a substrate on which a polysilicon film and a silicon oxide film are exposed so as to etch the polysilicon film while inhibiting etching the silicon oxide film. In this case, it is required to uniformly etch the polysilicon film while maintaining the selectivity (the etching speed of the polysilicon film/the etching speed of the silicon oxide film) at a high value.

A polysilicon film is composed of many minute silicon single crystals. Silicon single crystal shows anisotropy with respect to TMAH. That is, the etching speed (the etching amount per unit time) when TMAH is supplied to silicon single crystal is different for each crystal plane of silicon single crystal (anisotropy of etching). The directions of the crystal planes exposed on the surface of the polysilicon film are various and differ depending on the location of the polysilicon film. Additionally, the directions of the crystal planes exposed on the surface of the polysilicon film are different for each of the polysilicon films.

Since there is anisotropy in silicon single crystal, when the polysilicon film is etched by TMAH, although it is slight, the etching amount of the polysilicon film differs depending on the location of the polysilicon film. Even when a plurality of the polysilicon films are etched by TMAH, although it is slight, the etching amount of the polysilicon film differs depending on the polysilicon film. Even such unevenness of etching may not be acceptable as patterns formed on the substrate are finer and finer.

Thus, an object of the present invention is to provide a substrate processing method and a substrate processing apparatus that are able to uniformly etch an etching object including polysilicon while inhibiting etching a non-etching object different from silicon single crystal or polysilicon.

Solution to Problem

A embodiment of the present invention provides a substrate processing method that supplies an alkaline etching liquid to a substrate on which an etching object including polysilicon and a non-etching object different from the etching object are exposed, and that includes an etching liquid making step of making the alkaline etching liquid including quaternary ammonium hydroxide, water and inhibitor that inhibits contact of a hydroxide ion generated from the quaternary ammonium hydroxide and the etching object, and a selective etching step of etching the etching object while inhibiting etching of the non-etching object by supplying the etching liquid made in the etching liquid making step to the substrate on which the etching object and the non-etching object are exposed.

According to this arrangement, the alkaline etching liquid including the quaternary ammonium hydroxide, the water and the inhibitor is supplied to the substrate on which the etching object including the polysilicon and the non-etching object different from the etching object are exposed. When the quaternary ammonium hydroxide dissolves in water, the quaternary ammonium hydroxide separates into a positive ion (a cation) and a hydroxide ion. The silicon single crystal included in the etching object reacts with the hydroxide ion and dissolves in the etching liquid. The etching speed of the etching object is greater than the etching speed of the non-etching object. Thus, the etching object is selectively etched.

The inhibitor inhibits the contact between the hydroxide ion and the etching object. That is, the inhibitor is a steric obstacle for hydroxide ions and reduces the number of hydroxide ions that react with the etching object. Thus, the etching speed of the etching object lowered. Furthermore, the etching speed does not decrease uniformly at a plurality of crystal planes of a silicon single crystal but decreases relatively greatly at a crystal plane among these at which the etching speed is high. Thus, the difference in the etching speed among the plurality of crystal planes decreases and anisotropy of silicon single crystal with respect to the etching liquid lowers. That is, the etching of silicon single crystal included in the etching object approaches isotropic etching and the etching object is etched with a uniform etching amount at every position.

The etching object may be a portion of the substrate itself or may be a portion of or the entire laminate formed on the substrate (a base material such as a silicon wafer). If the etching conditions such as directions of crystal planes and temperatures are the same, the etching speed of silicon single crystal when the alkaline etching liquid including the quaternary ammonium hydroxide, the water and the inhibitor is supplied is smaller than the etching speed of silicon single crystal when the alkaline etching liquid including the quaternary ammonium hydroxide and the water and not including the inhibitor is supplied.

In the present embodiment, at least one of the following features may be added to the substrate processing method.

The etching liquid making step includes a concentration determining step of determining concentration of the inhibitor in the etching liquid based on a target value of a difference of etching speeds of a plurality of crystal planes of a silicon single crystal constituting the polysilicon.

The concentration of the inhibitor in the etching liquid made in the etching liquid making step is 20 percent concentration of mass or more, and less 100 percent concentration of mass.

A molecule of the inhibitor is larger than the hydroxide ion.

As described above, the hydroxide ion in the etching liquid is blocked by the inhibitor in the etching liquid. If the number of molecules of the inhibitors existing in the etching liquid is the same, the larger the molecule of the inhibitor, the harder it is for the hydroxide ion to reach the etching object. Like this arrangement, the number of the hydroxide ions that come into contact with the etching object can be efficiently reduced by using the inhibitor a molecule of which is larger than the hydroxide ion.

The etching liquid making step includes a pre-discharge mixing step of mixing the quaternary ammonium hydroxide, the water and the inhibitor before the etching liquid is discharged from a discharge port, and the selective etching step includes a discharging step of causing the discharge port to discharge the etching liquid made in the etching liquid making step toward the substrate.

According to this arrangement, the quaternary ammonium hydroxide, the water and the inhibitor are mixed not after being discharged from the discharge port, but before being discharged from the discharge port. Thus, the etching liquid in which the quaternary ammonium hydroxide, the water and the inhibitor are uniformly mixed is made. After that, the etching liquid is discharged toward the substrate from the discharge port and supplied to the substrate. Thus, the substrate can be uniformly processed as compared to a case of mixing the quaternary ammonium hydroxide, the water and the inhibitor after being discharged from the discharge port.

The pre-discharge mixing step may be an in-tank mixing step of mixing the quaternary ammonium hydroxide, the water and the inhibitor at the inside of a tank connected to the discharge port via piping, or may be an in-flow path mixing step of mixing the quaternary ammonium hydroxide, the water and the inhibitor at the inside of a flow path (piping or a nozzle) that guides liquid toward the discharge port. The etching liquid making step may include, instead of the pre-discharge mixing step, any of an in-air mixing step of mixing the quaternary ammonium hydroxide, the water and the inhibitor at a space between the discharge port and the substrate and an on-substrate mixing step of mixing the quaternary ammonium hydroxide, the water and the inhibitor at the substrate.

The substrate processing method further includes a natural oxide film removing step of supplying an oxide film removing liquid to the substrate and removing a natural oxide film of the etching object before the selectively etching step.

According to this arrangement, the oxide film removing liquid is supplied to the substrate and the natural oxide film of the etching object is removed from the surface layer of the etching object. After that, the etching liquid is supplied to the substrate and the etching object is selectively etched. The natural oxide film of the etching object is mainly composed of silicon oxide. The etching liquid is liquid that etches the etching object and does not etch or hardly etches silicon oxide. This is because a hydroxide ion reacts with silicon, but does not react with or hardly reacts with silicon oxide. Thus, it is possible to effectively etch the etching object by removing the natural oxide film of the etching object in advance.

The etching object is a thin film obtained by performing a plurality of steps including a deposition step of depositing the polysilicon and a heat treatment step of heating the polysilicon deposited in the deposition step.

According to this arrangement, the etching object, for which the heat treatment step to heat the deposited polysilicon is executed, is etched by the alkaline etching liquid. When the deposited polysilicon is heated under an appropriate condition, the grain size of the polysilicon increases. Thus, as compared to a case where the heat treatment step is not executed, silicon single crystals included in the etching object increase in size. It means that the number of the silicon single crystals exposed on the surface of the etching object decreases and the influence of the anisotropy increases. Thus, it is possible to effectively lower the influence of the anisotropy by supplying such an etching object with the etching liquid including the quaternary ammonium hydroxide, the water and the inhibitor.

The etching liquid making step includes a dissolved oxygen concentration changing step of lowering dissolved oxygen concentration of at least one of the quaternary ammonium hydroxide, the water and the inhibitor.

According to this arrangement, the dissolved oxygen concentration of at least one of the quaternary ammonium hydroxide, the water and the inhibitor is lowered. Thus, the dissolved oxygen concentration of the etching liquid made by these is lowered. When the etching liquid with the high dissolved oxygen concentration is supplied to the substrate, a portion of the surface layer of the etching object is oxidized and changed to silicon oxide. It means that the etching speed of the etching object is further lowered. Thus, it is possible to lower anisotropy of silicon single crystal while reducing the decrease in the etching speed of the etching object by supplying the substrate with the etching liquid the dissolved oxygen concentration of which is low.

The dissolved oxygen concentration changing step may be a gas dissolving step of dissolving low oxygen gas, which has an oxygen concentration lower than an oxygen concentration in air (about 21 vol % (percent concentration of volume)), in at least one of the quaternary ammonium hydroxide, the water and the inhibitor or may be a step other than the gas dissolving step such as a pressure-decreasing step of decreasing air pressure in a tank that stores at least one of the quaternary ammonium hydroxide, the water and the inhibitor.

The substrate processing method further includes an atmosphere oxygen concentration changing step of lowering oxygen concentration in an atmosphere that is in contact with the etching liquid held by the substrate.

According to this arrangement, the etching liquid is supplied to the substrate in a state where the oxygen concentration in the atmosphere is low. Thus, the amount of the oxygen dissolved in the etching liquid from the atmosphere decreases and the rise in the dissolved oxygen concentration is reduced. When the etching liquid with the high dissolved oxygen concentration is supplied to the substrate, the etching speed of the etching object is further lowered. Thus, it is possible to reduce the further decrease in the etching speed by lowering the oxygen concentration in the atmosphere.

The inhibitor is glycol.

The etching liquid making step is a step of making the alkaline etching liquid including TMAH (tetramethylammonium hydroxide) as the quaternary ammonium hydroxide, the water and propylene glycol as the glycol.

Another embodiment of the present invention provides a substrate processing apparatus that supplies an alkaline etching liquid to a substrate on which an etching object including polysilicon and a non-etching object different from the etching object are exposed, and that includes an etching liquid making means to make the alkaline etching liquid including quaternary ammonium hydroxide, water and inhibitor that inhibits contact of a hydroxide ion generated from the quaternary ammonium hydroxide and the etching object, and a selective etching means to etch the etching object while inhibiting etching of the non-etching object by supplying the etching liquid made by the etching liquid making means to the substrate on which the etching object and the non-etching object are exposed. According to this arrangement, the same effects as the effects described above can be obtained.

In the present embodiment, at least one of the following features may be added to the substrate processing apparatus.

The etching liquid making means includes a concentration determining means to determine concentration of the inhibitor in the etching liquid based on a target value of a difference of etching speeds of a plurality of crystal planes of a silicon single crystal constituting the polysilicon.

The concentration of the inhibitor in the etching liquid made by the etching liquid making means is 20 percent concentration of mass or more, and less 100 percent concentration of mass.

A molecule of the inhibitor is larger than the hydroxide ion. According to this arrangement, the same effects as the effects described above can be obtained.

The selective etching means includes a discharge port to discharge the etching liquid made by the etching liquid making means toward the substrate, and the etching liquid making means includes a mixing means to mix the quaternary ammonium hydroxide, the water and the inhibitor before the etching liquid is discharged from the discharge port. According to this arrangement, the same effects as the effects described above can be obtained.

The substrate processing apparatus further includes a natural oxide film removing means to supply an oxide film removing liquid to the substrate and to remove a natural oxide film of the etching object before the etching liquid made by the etching liquid making means is supplied to the substrate. According to this arrangement, the same effects as the effects described above can be obtained.

The etching liquid making means includes a dissolved oxygen concentration changing means to lower dissolved oxygen concentration of at least one of the quaternary ammonium hydroxide, the water and the inhibitor. According to this arrangement, the same effects as the effects described above can be obtained.

The substrate processing apparatus further includes an atmosphere oxygen concentration changing means to lower oxygen concentration in an atmosphere that is in contact with the etching liquid held by the substrate. According to this arrangement, the same effects as the effects described above can be obtained.

The inhibitor is glycol.

The etching liquid making means is a means to make the alkaline etching liquid including TMAH (tetramethylammonium hydroxide) as the quaternary ammonium hydroxide, the water and propylene glycol as the glycol.

The above and other objects, features and advantages of the present invention will become more apparent from the following detailed description of the embodiments with reference to the attached drawings.

BRIEF DESCRIPTION OF THE DRAWINGS

FIG. 9 a graph showing an example of the relationship between the etching speeds of the three crystal planes of silicon single crystal and the concentration of propylene glycol in an etching liquid.

DETAILED DESCRIPTION OF PREFERRED EMBODIMENTS

Figure 1A:
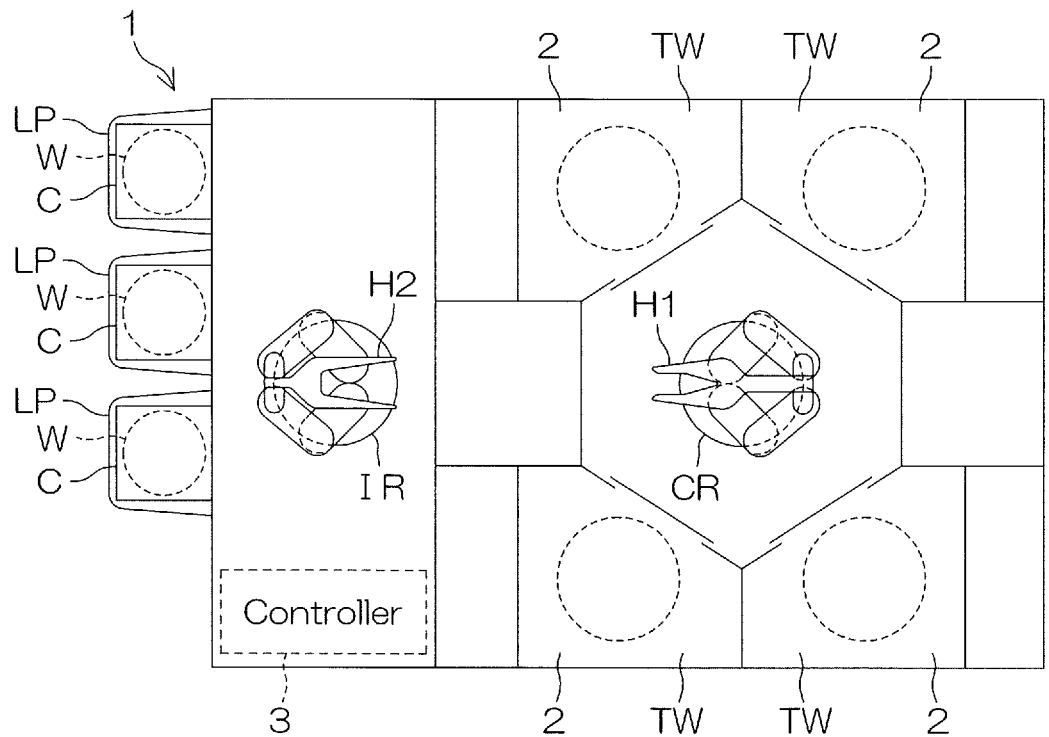
FIG. 1A a schematic view of a substrate processing apparatus according to a first embodiment of the present invention when viewed from above.
Figure 1B:
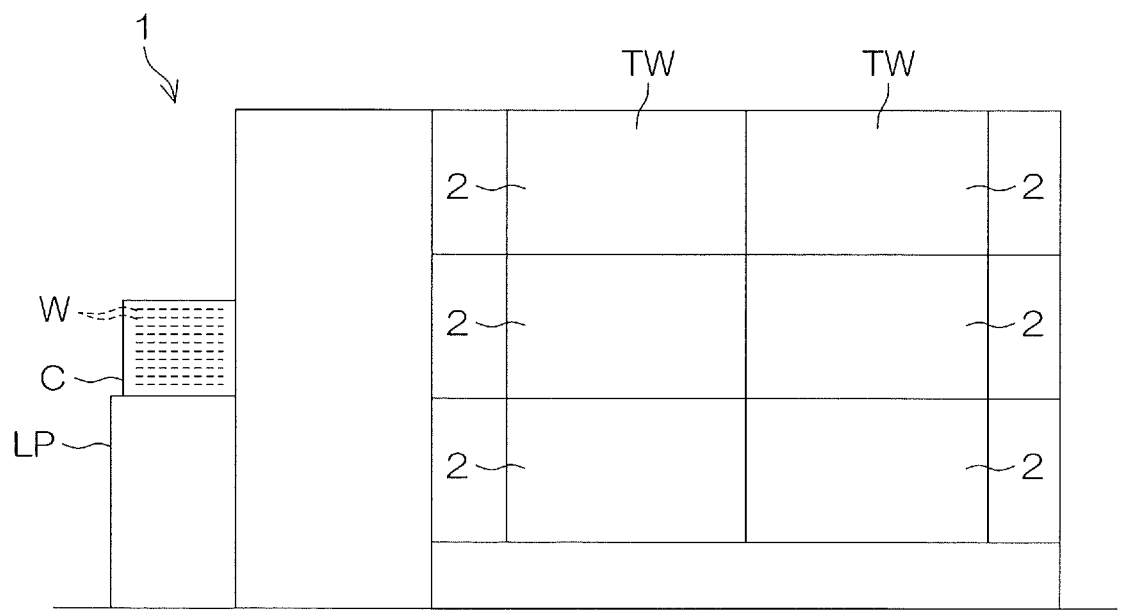
FIG. 1B a schematic view of the substrate processing apparatus when viewed from a side.

FIG. 1A is a schematic view of a substrate processing apparatus 1 according to a first embodiment of the present invention when viewed from above. FIG. 1B is a schematic view of the substrate processing apparatus 1 when viewed from a side.

The substrate processing apparatus 1 is a single substrate processing-type apparatus which processes disc-shaped substrates W such as semiconductor wafers one by one. The substrate processing apparatus 1 includes a load port LP which holds a carrier C that houses the substrates W, a plurality of processing units 2 which process the substrates W transferred from the carrier C on the load port LP, a transfer robot which transfers the substrates W between the carrier C on the load port LP and the processing units 2 and a controller 3 which controls the substrate processing apparatus 1.

The transfer robot includes an indexer robot IR which carries the substrates W into and out from the carrier C on the load port LP and a center robot CR which carries the substrates W into and out from the processing units 2. The indexer robot IR transfers the substrates W between the load port LP and the center robot CR, the center robot CR transfers the substrates W between the indexer robot IR and the processing units 2. The center robot CR includes a hand H1 which supports the substrate W and the indexer robot IR includes a hand H2 which supports the substrate W.

The plurality of processing units 2 form a plurality of towers TW disposed around the center robot CR in a plan view. FIG. 1A shows an example in which four towers TW are formed. The center robot CR is able to access any one of the towers TW. As shown in FIG. 1B, each tower TW includes a plurality of processing units 2 (for example, three processing units 2) stacked vertically.

Figure 2:
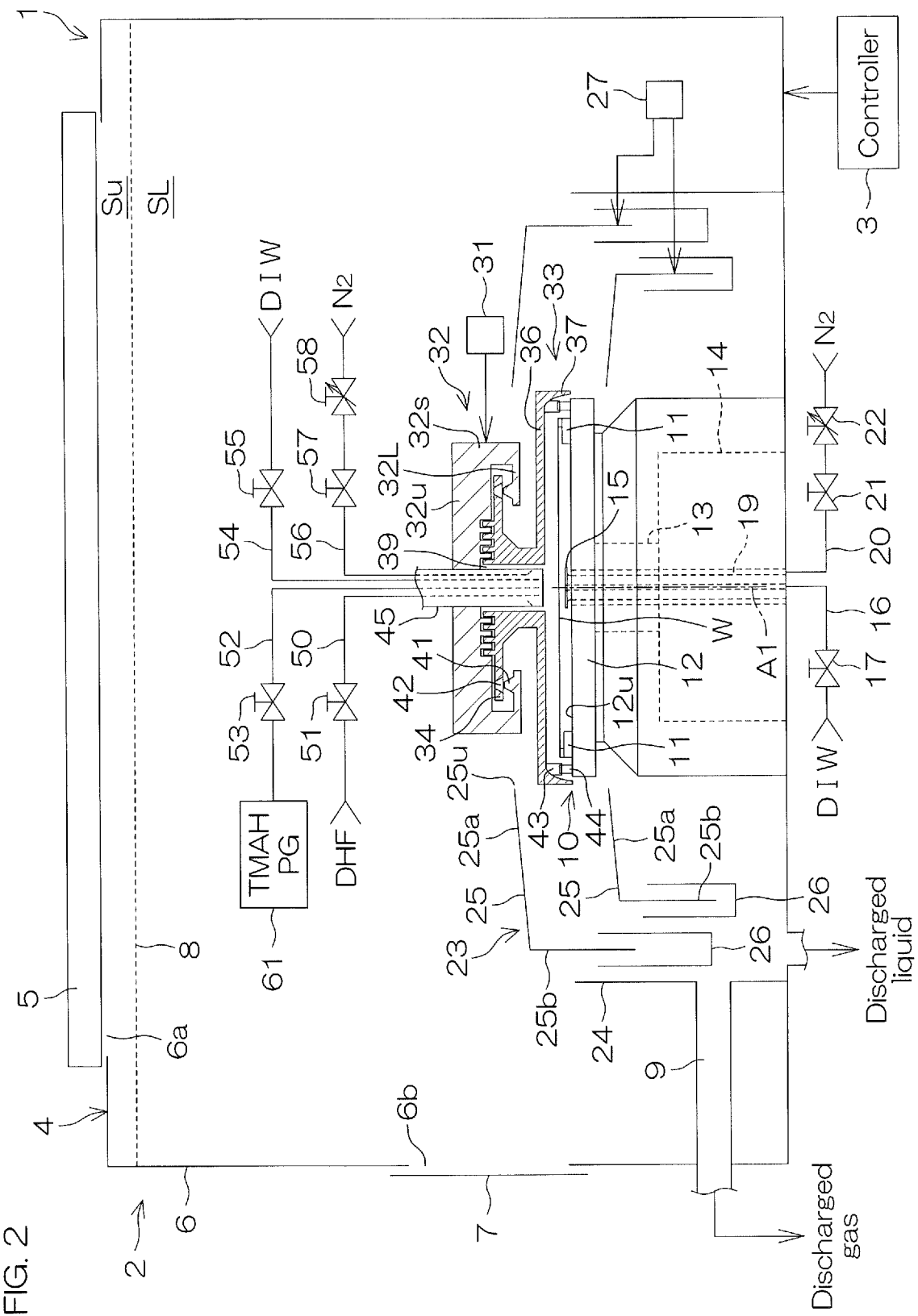
FIG. 2 a schematic view of the interior of a processing unit included in the substrate processing apparatus when viewed horizontally.
Figure 3:
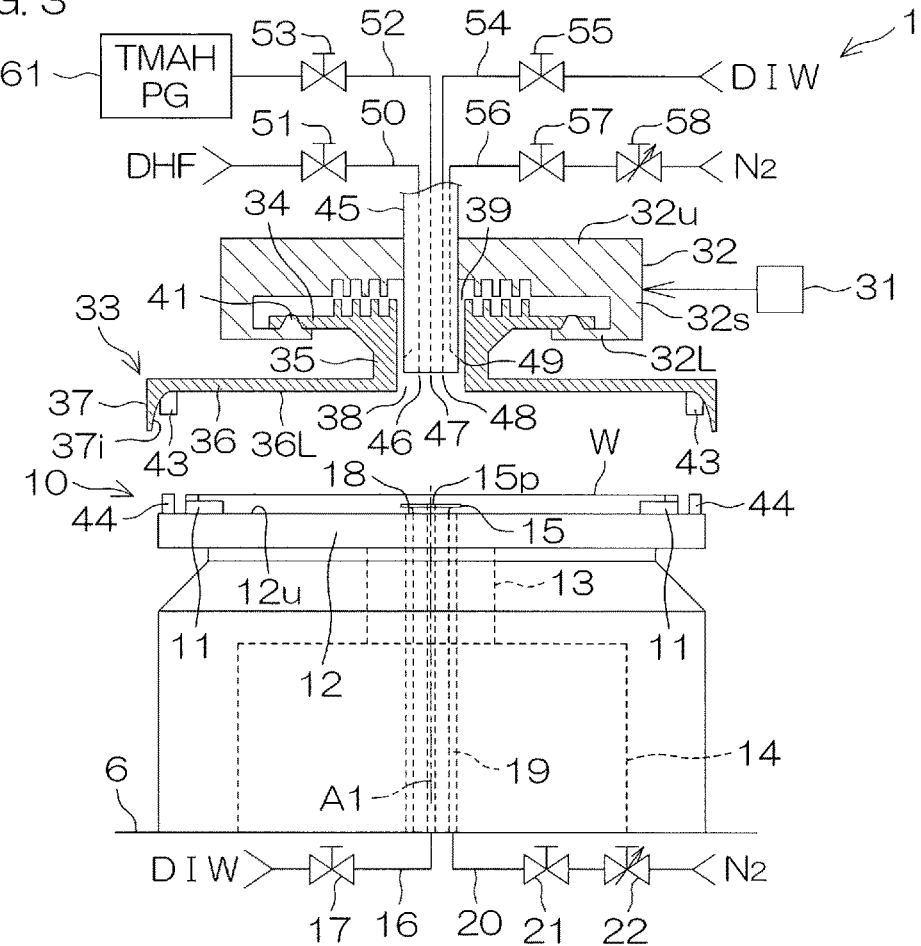
FIG. 3 an enlarged view of a portion of FIG. 2.

FIG. 2 is a schematic view of the interior of a processing unit 2 included in the substrate processing apparatus 1 when viewed horizontally. FIG. 3 is an enlarged view of a portion of FIG. 2. FIG. 2 shows a state where the raising/lowering frame 32 and the shielding member 33 are located at lower positions and FIG. 3 shows a state where the raising/lowering frame 32 and the shielding member 33 are located at upper positions. In the following description, unless otherwise specified, TMAH represents aqueous solution of TMAH.

The processing unit 2 includes a box-shaped chamber 4 which has an internal space, a spin chuck 10 which rotates one substrate W around a vertical rotation axis A1 passing through the central portion of the substrate W while holding the substrate W horizontally within the chamber 4 and a tubular processing cup 23 which surrounds the spin chuck 10 around the rotation axis A1.

The chamber 4 includes a box-shaped partition wall 6 provided with a carry-in/carry-out port 6b through which the substrate W passes, and a shutter 7 which opens and closes the carry-in/carry-out port 6b. The chamber 4 further includes a rectifying plate 8 which is arranged below an air outlet 6a that is open in the ceiling surface of the partition wall 6. An FFU 5 (fan filter unit) which feeds clean air (air filtered by a filter) is arranged on the air outlet 6a. An exhaust duct 9 which discharges a gas within the chamber 4 is connected to the processing cup 23. The air outlet 6a is provided in an upper end portion of the chamber 4, and the exhaust duct 9 is arranged in a lower end portion of the chamber 4. A portion of the exhaust duct 9 is arranged outside the chamber 4.

The rectifying plate 8 partitions the internal space of the partition wall 6 into an upper space Su above the rectifying plate 8 and a lower space SL below the rectifying plate 8. The upper space Su between the ceiling surface of the partition wall 6 and the upper surface of the rectifying plate 8 is a diffusion space in which the clean air diffuses. The lower space SL between the lower surface of the rectifying plate 8 and the floor surface of the partition wall 6 is a processing space in which the substrate W is processed. The spin chuck 10 and the processing cup 23 are arranged in the lower space SL. A distance in a vertical direction from the floor surface of the partition wall 6 to the lower surface of the rectifying plate 8 is longer than a distance in the vertical direction from the upper surface of the rectifying plate 8 to the ceiling surface of the partition wall 6.

The FFU 5 feeds the clean air via the air outlet 6a to the upper space Su. The clean air supplied to the upper space Su hits the rectifying plate 8 and diffuses in the upper space Su. The clean air within the upper space Su passes through a plurality of through holes which vertically penetrate the rectifying plate 8 and flows downward from the entire region of the rectifying plate 8. The clean air supplied to the lower space SL is sucked into the processing cup 23 and is discharged through the exhaust duct 9 from the lower end portion of the chamber 4. Thus, a uniform downward flow (down flow) of the clean air which flows downward from the rectifying plate 8 is formed in the lower space SL. The processing of the substrate W is performed in a state where the downward flow of the clean air is formed.

The spin chuck 10 includes a disc-shaped spin base 12 which is held by a horizontal posture, a plurality of chuck pins 11 which hold the substrate W in the horizontal posture above the spin base 12, a spin shaft 13 which extends downward from the central portion of the spin base 12 and a spin motor 14 which rotates the spin shaft 13 so as to rotate the spin base 12 and the chuck pins 11. The spin chuck 10 is not limited to a clamping type chuck which brings the chuck pins 11 into contact with the outer circumferential surface of the substrate W, and the spin chuck 10 may be a vacuum-type chuck which sucks the rear surface (lower surface) of the substrate W that is a non-device formation surface to the upper surface 12u of the spin base 12 so as to hold the substrate W horizontally.

The spin base 12 includes the upper surface 12u which is arranged below the substrate W. The upper surface 12u of the spin base 12 is parallel to the lower surface of the substrate W. The upper surface 12u of the spin base 12 is an opposed surface which faces the lower surface of the substrate W. The upper surface 12u of the spin base 12 has a circular ring-shaped configuration which surrounds the rotation axis A1. The outside diameter of the upper surface 12u of the spin base 12 is larger than that of the substrate W. The chuck pins 11 protrude upward from the outer circumferential portion of the upper surface 12u of the spin base 12. The chuck pins 11 are held on the spin base 12. The substrate W is held on the chuck pins 11 in a state where the lower surface of the substrate W is separated from the upper surface 12u of the spin base 12.

The processing unit 2 includes a lower surface nozzle 15 which discharges the processing liquid toward the central portion of the lower surface of the substrate W. The lower surface nozzle 15 includes a nozzle disc portion which is arranged between the upper surface 12u of the spin base 12 and the lower surface of the substrate W and a nozzle tubular portion which extends downward from the nozzle disc portion. The liquid discharge port 15p of the lower surface nozzle 15 is open in the central portion of the upper surface of the nozzle disc portion. In a state where the substrate W is held on the spin chuck 10, the liquid discharge port 15p of the lower surface nozzle 15 faces the central portion of the lower surface of the substrate W.

The substrate processing apparatus 1 includes lower rinse liquid piping 16 which guide a rinse liquid to the lower surface nozzle 15 and a lower rinse liquid valve 17 which is interposed in the lower rinse liquid piping 16. When the lower rinse liquid valve 17 is opened, the rinse liquid guided by the lower rinse liquid piping 16 is discharged upward from the lower surface nozzle 15 and supplied to the central portion of the lower surface of the substrate W. The rinse liquid supplied to the lower surface nozzle 15 is pure water (DIW: deionized water). The rinse liquid supplied to the lower surface nozzle 15 is not limited to pure water, and may be any one of IPA (isopropyl alcohol), carbonated water, electrolytic ion water, hydrogen water, ozone water and a hydrochloric acid water of a dilute concentration (for example, about 1 to 100 ppm).

Although not shown, the lower rinse liquid valve 17 includes a valve body provided with an internal flow path where the liquid flows and an annular valve seat surrounding the internal flow path, a valve member which is movable with respect to the valve seat and an actuator which moves the valve member between a closed position where the valve member contacts the valve seat and an opened position where the valve member is separated from the valve seat. The same applies to other valves. The actuator may be a pneumatic actuator or an electric actuator or an actuator other than those. The controller 3 controls the actuator to open and close the lower rinse liquid valve 17.

The outer circumferential surface of the lower surface nozzle 15 and the inner circumferential surface of the spin base 12 defines a lower tubular path 19 which extends vertically. The lower tubular path 19 includes a lower central opening 18 which is open in the central portion of the upper surface 12u of the spin base 12. The lower central opening 18 is arranged below the nozzle disc portion of the lower surface nozzle 15. The substrate processing apparatus 1 includes lower gas piping 20 which guide an inert gas supplied via the lower tubular path 19 to the lower central opening 18, a lower gas valve 21 which is interposed in the lower gas piping 20 and a lower gas flow rate adjusting valve 22 which changes the flow rate of the inert gas supplied from the lower gas piping 20 to the lower tubular path 19.

The inert gas supplied from the lower gas piping 20 to the lower tubular path 19 is nitrogen gas. The inert gas is not limited to nitrogen gas, and may be another inert gas such as helium gas or argon gas. These inert gases are low oxygen gases which have an oxygen concentration lower than an oxygen concentration in air (about 21% of the volume).

When the lower gas valve 21 is opened, the nitrogen gas supplied from the lower gas piping 20 to the lower tubular path 19 is discharged upward from the lower central opening 18 at a flow rate corresponding to the degree of opening of the lower gas flow rate adjusting valve 22. Thereafter, the nitrogen gas flows radially in all directions in a space between the lower surface of the substrate Wand the upper surface 12u of the spin base 12. Thus, the space between the substrate W and the spin base 12 is filled with the nitrogen gas, and thus an oxygen concentration in an atmosphere is reduced. The oxygen concentration in the space between the substrate W and the spin base 12 is changed according to the degree of opening of the lower gas valve 21 and the lower gas flow rate adjusting valve 22. The lower gas valve 21 and the lower gas flow rate adjusting valve 22 are included in an atmosphere oxygen concentration changing unit that changes oxygen concentration in an atmosphere that is in contact with the substrate W.

The processing cup 23 includes a plurality of guards 25 which receive the liquid discharged outward from the substrate W, a plurality of cups 26 which receive the liquid guided downward by the guards 25 and a cylindrical outer wall member 24 which surrounds the guards 25 and the cups 26. FIG. 2 shows an example where two guards 25 and two cups 26 are provided.

The guard 25 includes a cylindrical guard tubular portion 25b which surrounds the spin chuck 10 and an annular guard ceiling portion 25a which extends obliquely upward from the upper end portion of the guard tubular portion 25b toward the rotation axis A1. Guard ceiling portions 25a vertically overlap each other, and guard tubular portions 25b are arranged concentrically. The cups 26 are arranged below the guard tubular portions 25b, respectively. The cup 26 defines an annular liquid receiving groove which is open upward.

The processing unit 2 includes a guard raising/lowering unit 27 which individually raises and lowers the guards 25. The guard raising/lowering unit 27 locates the guard 25 in an arbitrary position from an upper position to a lower position. The upper position is the position in which the upper end 25u of the guard 25 is arranged higher than a holding position in which the substrate W held by the spin chuck 10 is arranged. The lower position is the position in which the upper end 25u of the guard 25 is arranged lower than the holding position. The annular upper end of the guard ceiling portion 25a corresponds to the upper end 25u of the guard 25. The upper end 25u of the guard 25 surrounds the substrate W and the spin base 12 in plan view.

When the processing liquid is supplied to the substrate W in a state where the spin chuck 10 rotates the substrate W, the processing liquid supplied to the substrate W is spun off from the substrate W. When the processing liquid is supplied to the substrate W, at least one of the upper ends 25u of the guards 25 is arranged higher than the substrate W. Thus, the processing liquid such as the chemical liquid or the rinse liquid which is discharged from the substrate W is received by any one of the guards 25 and guided to the cup 26 corresponding to this guard 25.

As shown in FIG. 3, the processing unit 2 includes the raising/lowering frame 32 which is arranged above the spin chuck 10, the shielding member 33 which is suspended from the raising/lowering frame 32, a center nozzle 45 which is inserted into the shielding member 33 and a shielding member raising/lowering unit 31 which raises and lowers the raising/lowering frame 32 so as to raise and lower the shielding member 33 and the center nozzle 45. The raising/lowering frame 32, the shielding member 33 and the center nozzle 45 are arranged below the rectifying plate 8.

The shielding member 33 includes a disc portion 36 which is arranged above the spin chuck 10 and a tubular portion 37 which extends downward from the outer circumferential portion of the disc portion 36. The shielding member 33 includes an inner surface which has a cup-shaped configuration that is concave upward. The inner surface of the shielding member 33 includes a lower surface 36L of the disc portion 36 and the inner circumferential surface 37i of the tubular portion 37. In the following description, the lower surface 36L of the disc portion 36 may also be referred to as the lower surface 36L of the shielding member 33.

The lower surface 36L of the disc portion 36 is an opposed surface which faces the upper surface of the substrate W. The lower surface 36L of the disc portion 36 is parallel to the upper surface of the substrate W. The inner circumferential surface 37i of the tubular portion 37 extends downward from the outer circumferential edge of the lower surface 36L of the lower surface 36L. The inside diameter of the tubular portion 37 is increased as the lower end of the inner circumferential surface 37i is approached. The inside diameter of the lower end of the inner circumferential surface 37i of the tubular portion 37 is larger than the diameter of the substrate W. The inside diameter of the lower end of the inner circumferential surface 37i of the tubular portion 37 may be larger than the outside diameter of the spin base 12. When the shielding member 33 is arranged in the lower position (position shown in FIG. 2) which will be described below, the substrate W is surrounded by the inner circumferential surface 37i of the tubular portion 37.

The lower surface 36L of the disc portion 36 has a circular ring-shaped configuration which surrounds the rotation axis A1. The inner circumferential edge of the lower surface 36L of the disc portion 36 defines an upper central opening 38 which is open in the central portion of the lower surface 36L of the disc portion 36. The inner circumferential surface of the shielding member 33 defines a through hole which extends upward from the upper central opening 38. The through hole of the shielding member 33 vertically penetrates the shielding member 33. The center nozzle 45 is inserted into the through hole of the shielding member 33. The outside diameter of the lower end of the center nozzle 45 is smaller than the diameter of the upper central opening 38.

The inner circumferential surface of the shielding member 33 is coaxial with the outer circumferential surface of the center nozzle 45. The inner circumferential surface of the shielding member 33 surrounds the outer circumferential surface of the center nozzle 45 across an interval in a radial direction (direction orthogonal to the rotation axis A1). The inner circumferential surface of the shielding member 33 and the outer circumferential surface of the center nozzle 45 define an upper tubular path 39 which extends vertically. The center nozzle 45 protrudes upward from the raising/lowering frame 32 and the shielding member 33. When the shielding member 33 is suspended from the raising/lowering frame 32, the lower end of the center nozzle 45 is arranged higher than the lower surface 36L of the disc portion 36. The processing liquid such as the chemical liquid or the rinse liquid is discharged downward from the lower end of the center nozzle 45.

The shielding member 33 includes a tubular connection portion 35 which extends upward from the disc portion 36, and an annular flange portion 34 which extends outward from the upper end portion of the connection portion 35. The flange portion 34 is arranged higher than the disc portion 36 and the tubular portion 37 of the shielding member 33. The flange portion 34 is parallel to the disc portion 36. The outside diameter of the flange portion 34 is smaller than that of the tubular portion 37. The flange portion 34 is supported on the lower plate 32L of the raising/lowering frame 32 which will be described below.

The raising/lowering frame 32 includes an upper plate 32u which is positioned higher than the flange portion 34 of the shielding member 33, a side ring 32s which extends downward from the upper plate 32u and surrounds the flange portion 34, and an annular lower plate 32L which extends inward from the lower end portion of the side ring 32s and is located below the flange portion 34 of the shielding member 33. The outer circumferential portion of the flange portion 34 is arranged between the upper plate 32u and the lower plate 32L. The outer circumferential portion of the flange portion 34 is movable vertically in a space between the upper plate 32u and the lower plate 32L.

The raising/lowering frame 32 and the shielding member 33 include locating protrusions 41 and locating holes 42 which restrict the relative movement of the raising/lowering frame 32 and the shielding member 33 in a circumferential direction (a direction around the rotation axis A1) in a state where the shielding member 33 is supported by the raising/lowering frame 32. FIG. 2 shows an example where a plurality of locating protrusions 41 are provided on the lower plate 32L and where a plurality of locating holes 42 are provided in the flange portion 34. The locating protrusions 41 may be provided on the flange portion 34, and the locating holes 42 may be provided in the lower plate 32L.

The locating protrusions 41 are arranged on a circle which has a center arranged on the rotation axis A1. Similarly, the locating holes 42 are arranged on a circle which has a center arranged on the rotation axis A1. The locating holes 42 are arranged in the circumferential direction with the same regularity as the locating protrusions 41. The locating protrusions 41 which protrude upward from the upper surface of the lower plate 32L are inserted into the locating holes 42 which extend upward from the lower surface of the flange portion 34. Thus, the movement of the shielding member 33 in the circumferential direction with respect to the raising/lowering frame 32 is restricted.

The shielding member 33 includes a plurality of upper support portions 43 which protrude downward from the inner surface of the shielding member 33. The spin chuck 10 includes a plurality of lower support portions 44 which supports the upper support portions 43, respectively. The upper support portions 43 are surrounded by the tubular portion 37 of the shielding member 33. The lower ends of the upper support portions 43 are arranged higher than the lower end of the tubular portion 37. The distance in the radial direction from the rotation axis A1 to the upper support portion 43 is larger than the radius of the substrate W. Similarly, the distance in the radial direction from the rotation axis A1 to the lower support portion 44 is larger than the radius of the substrate W. The lower support portions 44 protrude upward from the upper surface 12u of the spin base 12. The lower support portions 44 are arranged on the outer side with respect to the chuck pins 11.

The upper support portions 43 are arranged on a circle which has a center arranged on the rotation axis A1. Similarly, the lower support portions 44 are arranged on a circle which has a center arranged on the rotation axis A1. The lower support portions 44 are arranged in the circumferential direction with the same regularity as the upper support portions 43. The lower support portions 44 are rotated together with the spin base 12 around the rotation axis A1. The rotational angle of the spin base 12 is changed by the spin motor 14. When the spin base 12 is arranged at a reference rotational angle, the upper support portions 43 respectively overlap the lower support portions 44 in plan view.

The shielding member raising/lowering unit 31 is coupled to the raising/lowering frame 32. When the shielding member raising/lowering unit 31 lowers the raising/lowering frame 32 in a state where the flange portion 34 of the shielding member 33 is supported on the lower plate 32L of the raising/lowering frame 32, the shielding member 33 is also lowered. When the shielding member raising/lowering unit 31 lowers the shielding member 33 in a state where the spin base 12 is arranged at such a reference rotational angle that the upper support portions 43 respectively overlap the lower support portions 44 in plan view, the lower end portions of the upper support portions contact the upper end portions of the lower support portions 44. Thus, the upper support portions 43 are respectively supported on the lower support portions 44.

When the shielding member raising/lowering unit 31 lowers the raising/lowering frame 32 after the upper support portions 43 of the shielding member 33 contact the lower support portions 44 of the spin chuck 10, the lower plate 32L of the raising/lowering frame 32 is moved downward with respect to the flange portion 34 of the shielding member 33. Thus, the lower plate 32L is separated from the flange portion 34, and thus the locating protrusions 41 are removed from the locating holes 42. Furthermore, the raising/lowering frame 32 and the center nozzle 45 are moved downward with respect to the shielding member 33, and thus the difference in height between the lower end of the center nozzle 45 and the lower surface 36L of the disc portion 36 of the shielding member 33 is reduced. Here, the raising/lowering frame 32 is arranged at such a height (the lower position which will be described below) that the flange portion 34 of the shielding member 33 does not contact the upper plate 32u of the raising/lowering frame 32.

The shielding member raising/lowering unit 31 locates the raising/lowering frame 32 in an arbitrary position from the upper position (position shown in FIG. 3) to the lower position (position shown in FIG. 2). The upper position is the position in which the locating protrusions 41 are inserted into the locating holes 42 and in which the flange portion 34 of the shielding member 33 contact the lower plate 32L of the raising/lowering frame 32. In other words, the upper position is the position in which the shielding member 33 is suspended from the raising/lowering frame 32. The lower position is the position in which the lower plate 32L is separated from the flange portion 34 and in which the locating protrusions 41 are removed from the locating holes 42. In other words, the lower position is the position in which the coupling of the raising/lowering frame 32 and the shielding member 33 is released and in which the shielding member 33 does not contact any portion of the raising/lowering frame 32.

When the raising/lowering frame 32 and the shielding member 33 are moved to the lower position, the lower ends of the tubular portion 37 of the shielding member 33 are arranged lower than the lower surface of the substrate W, and thus the space between the upper surface of the substrate W and the lower surface 36L of the shielding member 33 is surrounded by the tubular portion 37 of the shielding member 33. Thus, the space between the upper surface of the substrate Wand the lower surface 36L of the shielding member 33 is shielded not only from an atmosphere above the shielding member 33 but also from an atmosphere around the shielding member 33. Therefore, it is possible to enhance the sealing performance to seal the space between the upper surface of the substrate Wand the lower surface 36L of the shielding member 33.

Furthermore, when the raising/lowering frame 32 and the shielding member 33 are arranged in the lower position, even if the shielding member 33 is rotated around the rotation axis A1, the shielding member 33 is prevented from colliding with the raising/lowering frame 32. When the upper support portions 43 of the shielding member 33 are supported on the lower support portions 44 of the spin chuck 10, the upper support portions 43 and the lower support portions 44 engage with each other, and thus the relative movement of the upper support portions 43 and the lower support portions 44 in the circumferential direction is prevented. When the spin motor 14 rotates in this state, the torque of the spin motor 14 is transmitted to the shielding member 33 via the upper support portions 43 and the lower support portions 44. Thus, the shielding member 33 rotates in the same direction and at the same speed as the spin base 12 in a state where the raising/lowering frame 32 and the center nozzle 45 are stationary.

The center nozzle 45 includes a plurality of liquid discharge ports through which the liquid is discharged and a gas discharge port through which the gas is discharged. The liquid discharge ports include a first chemical liquid discharge port 46 through which a first chemical liquid is discharged, a second chemical liquid discharge port 47 through which a second chemical liquid is discharged and an upper rinse liquid discharge port 48 through which the rinse liquid is discharged. The gas discharge port is an upper gas discharge port 49 through which an inert gas is discharged. The first chemical liquid discharge port 46, the second chemical liquid discharge port 47, the upper rinse liquid discharge port 48 are open in the lower end of the center nozzle 45. The upper gas discharge port 49 is open in the outer circumferential surface of the center nozzle 45.

Each of the first chemical liquid and the second chemical liquid is a liquid which contains at least one of sulfuric acid, nitric acid, hydrochloric acid, hydrofluoric acid, phosphoric acid, acetic acid, ammonia water, hydrogen peroxide water, organic acids (for example, citric acid, oxalic acid), organic alkalis (for example, TMAH: tetramethylammonium hydroxide), a surfactant, a polyhydric alcohol and a corrosion inhibitor, for example. Sulfuric acid, nitric acid, hydrochloric acid, hydrofluoric acid, phosphoric acid, acetic acid, ammonia water, hydrogen peroxide water, citric acid, oxalic acid and TMAH are etching liquids.

The first chemical liquid and the second chemical liquid may be the same types of chemical liquid or may be different types of chemical liquids. FIG. 2, etc., show an example where the first chemical liquid is DHF (dilute hydrofluoric acid) and where the second chemical liquid is a mixed liquid of TMAH and propylene glycol. Also, FIG. 2, etc., show the example where the rinse liquid supplied to the center nozzle 45 is pure water and where the inert gas supplied to the center nozzle 45 is nitrogen gas. The rinse liquid supplied to the center nozzle 45 may be a rinse liquid other than pure water. The inert gas supplied to the center nozzle 45 may be an inert gas other than nitrogen gas.

The substrate processing apparatus 1 includes a chemical liquid making unit 61 that makes an alkaline etching liquid corresponding to the second chemical liquid. The etching liquid is a liquid with pH (hydrogen-ion exponent) of 12 or more, for example. The etching liquid is a solution including quaternary ammonium hydroxide, water ($H_2O$) and inhibitor. FIG. 2, etc., show an example where the quaternary ammonium hydroxide is TMAH and where the inhibitor is PG (propylene glycol). As long as it is not an oxidizing agent that oxidizes a front surface of the substrate W (a surface of a base material) or a surface of a laminate formed on the substrate W, the etching liquid may further include a substance other than the quaternary ammonium hydroxide, the water and the inhibitor.

The quaternary ammonium hydroxide may be at least one of TMAH, TBAH (Tetrabutylammonium hydroxide), TPeAH (Tetrapentylammonium hydroxide), THAH (Tetrahexylammonium hydroxide), TEAH (Tetraethylammonium hydroxide), and TPAH (Tetrapropylammonium hydroxide), or may be other than these. All of these are contained in organic alkali. It is noted that in this paragraph TMAH means anhydride, not aqueous solution. This applies to other quaternary ammonium hydroxides such as TBAH.

When the quaternary ammonium hydroxide dissolves in water, the quaternary ammonium hydroxide separates into a positive ion (a cation) and a hydroxide ion. The inhibitor is a substance that inhibits contact of the hydroxide ion generated from the quaternary ammonium hydroxide and an etching object including polysilicon. The molecule of the inhibitor is preferably larger than the hydroxide ion. The inhibitor is also preferably a water-soluble substance that dissolves in water. The inhibitor may be a surfactant including both of hydrophilic groups and hydrophobic groups. As long as it is uniformly dispersed in a solution including the quaternary ammonium hydroxide and the water, the inhibitor may be an insoluble substance that does not dissolve in water.

The inhibitor is glycol, for example. The glycol is at least one of ethylene glycol, diethylene glycol and propylene glycol. The inhibitor may be a substance other than glycol such as glycerin. Glycol is an example of a substance that is not involved in the reaction between silicon (Si) and hydroxide ion (OH⁻). That is, glycol is an example of a substance that does not react with atoms etc., involved in the reaction between silicon and hydroxide ion. Glycol is an example of a substance that does not act as a catalyst in this reaction. Glycol is preferably propylene glycol.

The substrate processing apparatus 1 includes first chemical liquid piping 50 which guide the first chemical liquid to the center nozzle 45, a first chemical liquid valve 51 which is interposed in the first chemical liquid piping 50, second chemical liquid piping 52 which guide the second chemical liquid to the center nozzle 45, a second chemical liquid valve 53 which is interposed in the second chemical liquid piping 52, upper rinse liquid piping 54 which guide the rinse liquid to the center nozzle 45 and an upper rinse liquid valve 55 which is interposed in the upper rinse liquid piping 54. The substrate processing apparatus 1 further includes upper gas piping 56 which guide the gas to the center nozzle 45, an upper gas valve 57 which is interposed in the upper gas piping 56 and an upper gas flow rate adjusting valve 58 which changes the flow rate of the gas supplied from the upper gas piping 56 to the center nozzle 45.

When the first chemical liquid valve 51 is opened, the first chemical liquid is supplied to the center nozzle 45 and is discharged downward from the first chemical liquid discharge port 46 which is open in the lower end of the center nozzle 45. When the second chemical liquid valve 53 is opened, the second chemical liquid made by the chemical liquid making unit 61 is supplied to the center nozzle 45 and is discharged downward from the second chemical liquid discharge port 47 which is open in the lower end of the center nozzle 45. When the upper rinse liquid valve 55 is opened, the rinse liquid is supplied to the center nozzle 45 and is discharged downward from the upper rinse liquid discharge port 48 which is open in the lower end of the center nozzle 45. Thus, the chemical liquid or the rinse liquid is supplied to the upper surface of the substrate W.

When the upper gas valve 57 is opened, the nitrogen gas guided by the upper gas piping 56 is supplied to the center nozzle 45 at a flow rate corresponding to the degree of opening of the upper gas flow rate adjusting valve 58 and is discharged obliquely downward from the upper gas discharge port 49 which is open in the outer circumferential surface of the center nozzle 45. Thereafter, the nitrogen gas flows downward within the upper tubular path 39 while flowing in the circumferential direction within the upper tubular path 39. The nitrogen gas that has reached the lower end of the upper tubular path 39 flows downward from the lower end of the upper tubular path 39. Thereafter, the nitrogen gas flows radially in all directions in the space between the upper surface of the substrate W and the lower surface 36L of the shielding member 33. Thus, the space between the substrate Wand the shielding member 33 is filled with the nitrogen gas, and the oxygen concentration in the atmosphere is reduced. The oxygen concentration in the space between the substrate W and the shielding member 33 is changed according to the degree of opening of the upper gas valve 57 and the upper gas flow rate adjusting valve 58.

The upper gas valve 57 and the upper gas flow rate adjusting valve 58 are included in the atmosphere oxygen concentration changing unit.

Figure 4:
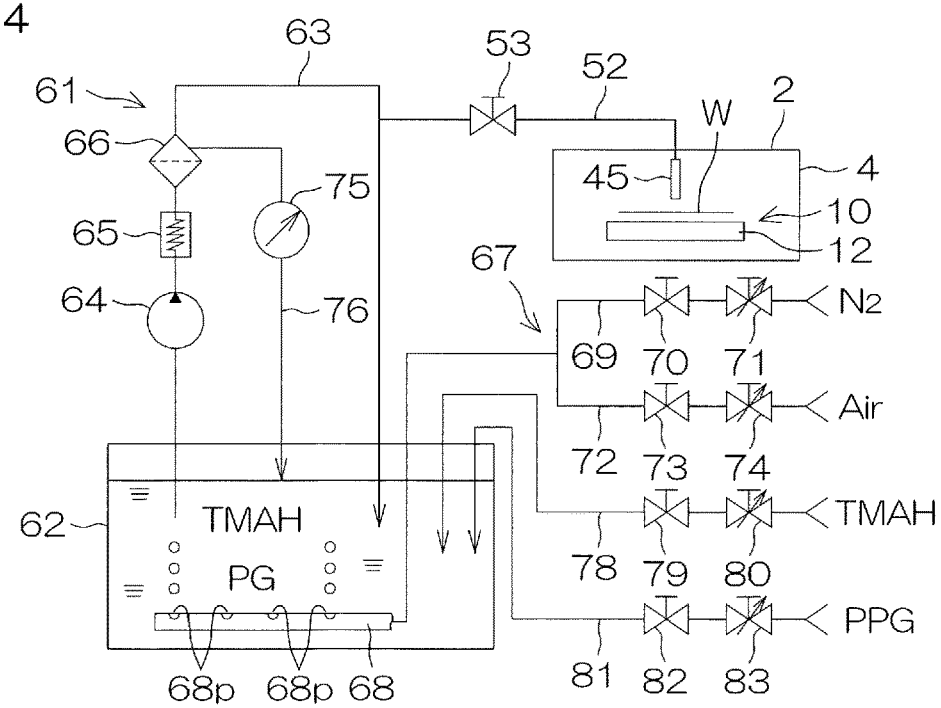
FIG. 4 a schematic view showing a chemical liquid making unit that makes chemical liquid to be supplied to a substrate and a dissolved oxygen concentration changing unit that adjusts the dissolved oxygen concentration of the chemical liquid.

FIG. 4 is a schematic view showing a chemical liquid making unit 61 that makes the chemical liquid to be supplied to the substrate W and a dissolved oxygen concentration changing unit 67 that adjusts the dissolved oxygen concentration of the chemical liquid.

The chemical liquid making unit 61 includes a tank 62 that stores the alkaline etching liquid corresponding to the second chemical liquid and circulation piping 63 that form an annular circulation path which circulates the etching liquid in the tank 62. The chemical liquid making unit 61 further includes a pump 64 that sends the etching liquid in the tank 62 to the circulation piping 63 and a filter 66 that removes foreign matters such as particles from the etching liquid flowing through the circulation path. In addition to these, the chemical liquid making unit 61 may include a temperature controller 65 that changes the temperature of the etching liquid in the tank 62 by heating or cooling the etching liquid.

An upstream end and a downstream end of the circulation piping 63 are connected to the tank 62. An upstream end of the second chemical liquid piping 52 is connected to the circulation piping 63, a downstream end of the second chemical liquid piping 52 is connected to the center nozzle 45. The pump 64, temperature controller 65 and the filter 66 are interposed into the circulation piping 63. Temperature controller 65 may be a heater that heats a liquid at a temperature higher than a room temperature (for example, 20 to 30 degrees Celsius), or may be a cooler that cools a liquid at a temperature lower than the room temperature, or may have both heating and cooling functions.

The pump 64 always sends the etching liquid in the tank 62 into the circulation piping 63. The etching liquid flows from the tank 62 to the upstream end of the circulation piping 63 and returns from the downstream end of the circulation piping 63 to the tank 62. Thus, the etching liquid in the tank 62 circulates in the circulation path. The temperature of the etching liquid is adjusted by the temperature controller 65 during the etching liquid is circulating in the circulation path. Thus, the etching liquid in the tank 62 is maintained at a constant temperature. When the second chemical liquid valve 53 is opened, some of the etching liquid flowing through the circulation piping 63 is supplied to the center nozzle 45 via the second chemical liquid piping 52. The temperature of the etching liquid supplied to the center nozzle 45 may be the room temperature or may be different from the room temperature.

The substrate processing apparatus 1 includes the dissolved oxygen concentration changing unit 67 that adjusts the dissolved oxygen concentration of the etching liquid. The dissolved oxygen concentration changing unit 67 includes gas supply piping 68 that dissolve gas in the etching liquid in the tank 62 by supplying gas into the tank 62. The dissolved oxygen concentration changing unit 67 further includes inert gas piping 69 that supply inert gas to the gas supply piping 68, an inert gas valve 70 that opens and closes between an open state in which inert gas flows from the inert gas piping 69 to the gas supply piping 68 and a close state in which inert gas is stopped at the inert gas piping 69, and an inert gas flow rate adjusting valve 71 that changes a flow rate of inert gas to be supplied to the gas supply piping 68 from the inert gas piping 69.

The gas supply piping 68 is a bubbling piping which includes gas discharge ports 68p which are arranged in the etching liquid in the tank 62. When the inert gas valve 70 is opened, that is, when the inert gas valve 70 is switched from the closed state to the opened state, the inert gas such as nitrogen gas is discharged from the gas discharge ports 68$p$ at a flow rate corresponding to the degree of opening of the inert gas flow rate adjusting valve 71. Thus, a large number of air bubbles are formed in the etching liquid in the tank 62, and thus the inert gas is dissolved in the etching liquid in the tank 62. Here, the dissolved oxygen is discharged from the etching liquid, and thus the dissolved oxygen concentration of the etching liquid is lowered. The dissolved oxygen concentration of the etching liquid in the tank 62 is changed by changing the flow rate of the nitrogen gas discharged from the gas discharge ports 68$p$.

The dissolved oxygen concentration change unit 67 may include, in addition to the inert gas piping 69, etc., an oxygen containing gas piping 72 which supplies an oxygen containing gas containing oxygen such as clean air to the gas supply piping 68, an oxygen containing gas valve 73 which is opened and closed between an opened state where the oxygen containing gas flows from the oxygen containing gas piping 72 to the gas supply piping 68 and a closed state where the oxygen containing gas is stopped at the oxygen containing gas piping 72 and an oxygen containing gas flow rate adjusting valve 74 which changes the flow rate of the oxygen containing gas supplied from the oxygen containing gas piping 72 to the gas supply piping 68.

When the oxygen containing gas valve 73 is opened, air which is an example of the oxygen containing gas is discharged from the gas discharge ports 68$p$ at a flow rate corresponding to the degree of opening of the oxygen containing gas flow rate adjusting valve 74. Thus, a large number of air bubbles are formed in the etching liquid in the tank 62, and thus the air is dissolved in the etching liquid in the tank 62. Air contains oxygen at about 21 vol %, whereas nitrogen gas does not contain oxygen or contains only a very small amount of oxygen. Thus, as compared to a case where the air is not supplied into the tank 62, it is possible to increase the dissolved oxygen concentration of the etching liquid in the tank 62 in a short period of time. For example, when the dissolved oxygen concentration of the etching liquid is excessively lowered with respect to a setting value, the air may be intentionally dissolved in the etching liquid in the tank 62.

The dissolved oxygen concentration change unit 67 may further include an oxygen meter 75 which measures the dissolved oxygen concentration of the etching liquid. FIG. 4 shows an example where the oxygen meter 75 is interposed in a measurement piping 76. The oxygen meter 75 may be interposed in the circulation piping 63. The upstream end of the measurement piping 76 is connected to the filter 66, and the downstream end of the measurement piping 76 is connected to the tank 62. The upstream end of the measurement piping 76 may be connected to the circulation piping 63. Some of the etching liquid within the circulation piping 63 flows into the measurement piping 76 and is returned to the tank 62. The oxygen meter 75 measures the dissolved oxygen concentration of the etching liquid which flows into the measurement piping 76. The degree of opening of at least one of the inert gas valve 70, the inert gas flow rate adjusting valve 71, the oxygen containing gas valve 73 and the oxygen containing gas flow rate adjusting valve 74 is changed according to the measurement value of the oxygen meter 75.

The chemical liquid making unit 61 includes hydroxide piping 78 that guide the quaternary ammonium hydroxide to be supplied to the tank 62, a hydroxide valve 79 that opens and closes the hydroxide piping 78, and a hydroxide flow rate adjusting valve 80 that changes the flow rate of the quaternary ammonium hydroxide to be supplied to the tank 62 from the hydroxide piping 78. The chemical liquid making unit 61 further includes inhibitor piping 81 that guide the inhibitor to be supplied to the tank 62, an inhibitor valve 82 that opens and closes the inhibitor piping 81 and an inhibitor flow rate adjusting valve 83 that changes the flow rate of the inhibitor to be supplied to the tank 62 from the inhibitor piping 81.

When the hydroxide valve 79 is opened, the quaternary ammonium hydroxide is supplied to the tank 62 at a flow rate corresponding to the hydroxide flow rate adjusting valve 80. Similarly, when the inhibitor valve 82 is opened, the inhibitor is supplied to the tank 62 at a flow rate corresponding to the inhibitor flow rate adjusting valve 83. The quaternary ammonium hydroxide supplied to the tank 62 from the hydroxide piping 78 may be liquid of the quaternary ammonium hydroxide or may be aqueous solution of the quaternary ammonium hydroxide. Similarly, the inhibitor supplied to the tank 62 from the inhibitor piping 81 may be liquid of the inhibitor or may be aqueous solution of the inhibitor. The chemical liquid making unit 61 may further include a stirrer that stirs the liquid in the tank 62.

When at least one of the quaternary ammonium hydroxide and the inhibitor is supplied to the tank 62, the concentration of the inhibitor included in the etching liquid in the tank 62 changes. An inhibitor concentration changing unit including the hydroxide valve 79, the hydroxide flow rate adjusting valve 80, the inhibitor valve 82 and the inhibitor flow rate adjusting valve 83 is controlled by the controller 3. The hydroxide valve 79 and the inhibitor valve 82 are closed except when making the etching liquid or changing the concentration of the inhibitor. In other words, when making the etching liquid or changing the concentration of the inhibitor, at least one of the hydroxide valve 79 and the inhibitor valve 82 is opened and the concentration of the inhibitor in the etching liquid is changed to an appropriate value.

Figure 5:
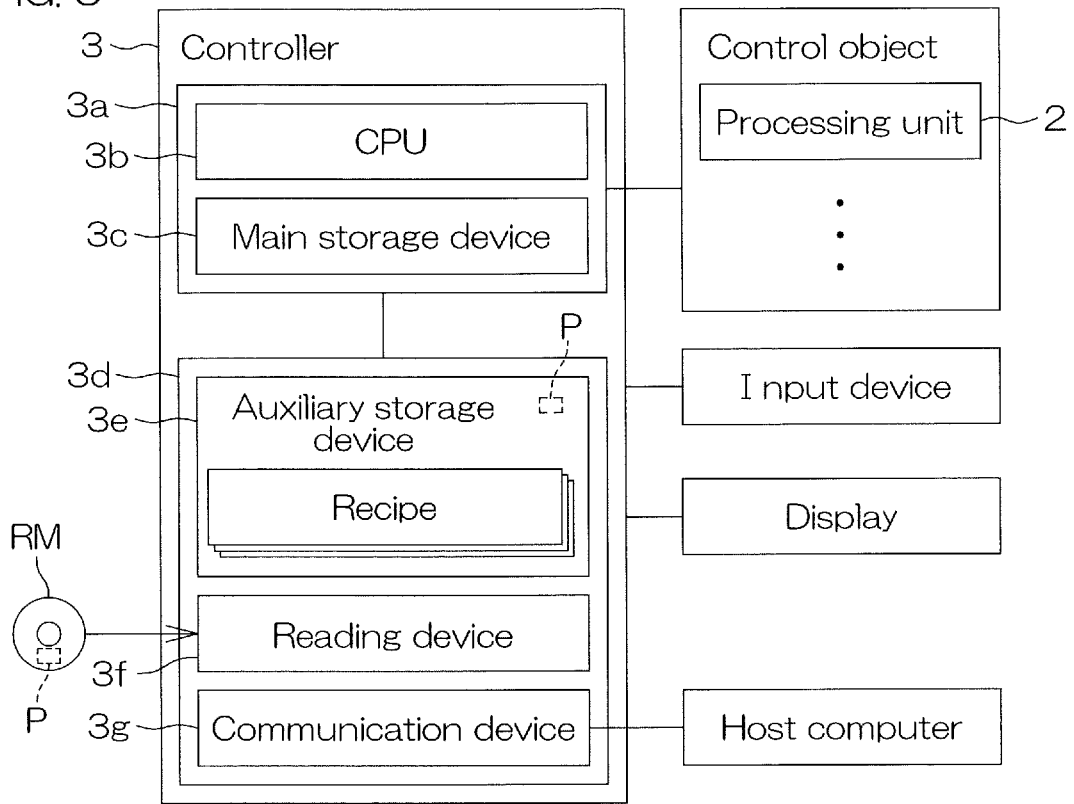
FIG. 5 a block diagram showing hardware of a controller.

FIG. 5 is a block diagram showing hardware of the controller 3.

The controller 3 is a computer which includes a computer main body 3$a$ and a peripheral device 3$d$ which is connected to the computer main body 3$a$. The computer main body 3$a$ includes a CPU 3$b$ (central processing unit) which executes various types of commands and a main storage device 3$c$ which stores information. The peripheral device 3$d$ includes an auxiliary storage device 3$e$ which stores information such as a program P, a reading device 3$f$ which reads information from a removable medium RM and a communication device 3$g$ which communicates with other devices such as a host computer.

The controller 3 is connected to an input device and a display. The input device is operated when an operator such as a user or a maintenance operator inputs information to the substrate processing apparatus 1. The information is displayed on the screen of the display. The input device may be any one of a keyboard, a pointing device and a touch panel or may be a device other than those. A touch panel display which serves both as the input device and the display may be provided in the substrate processing apparatus 1.

The CPU 3$b$ executes the program P stored in the auxiliary storage device 3$e$. The program P within the auxiliary storage device 3$e$ may be previously installed in the controller 3, may be fed through the reading device 3$f$ from the removable medium RM to the auxiliary storage device 3$e$ or may be fed from an external device such as the host computer to the auxiliary storage device 3$e$ through the communication device 3$g$.

The auxiliary storage device 3e and the removable medium RM are nonvolatile memories which retain memory even without power being supplied. The auxiliary storage device 3e is, for example, a magnetic storage device such as a hard disk drive. The removable medium RM is, for example, an optical disc such as a compact disc or a semiconductor memory such as a memory card. The removable medium RM is an example of a computer readable recording medium in which the program P is recorded. The removable medium RM is a non-transitory tangible recording medium.

The auxiliary storage device 3e stores a plurality of recipes. The recipe is information which specifies the details of processing, processing conditions and processing procedures of the substrate W. A plurality of recipes differ from each other in at least one of the details of processing, the processing conditions and the processing procedures of the substrate W. The controller 3 controls the substrate processing apparatus 1 such that the substrate W is processed according to the recipe designated by the host computer. The controller 3 executes individual steps described below by controlling the substrate processing apparatus 1. In other words, the controller 3 is programmed to execute the individual steps.

Figure 6:
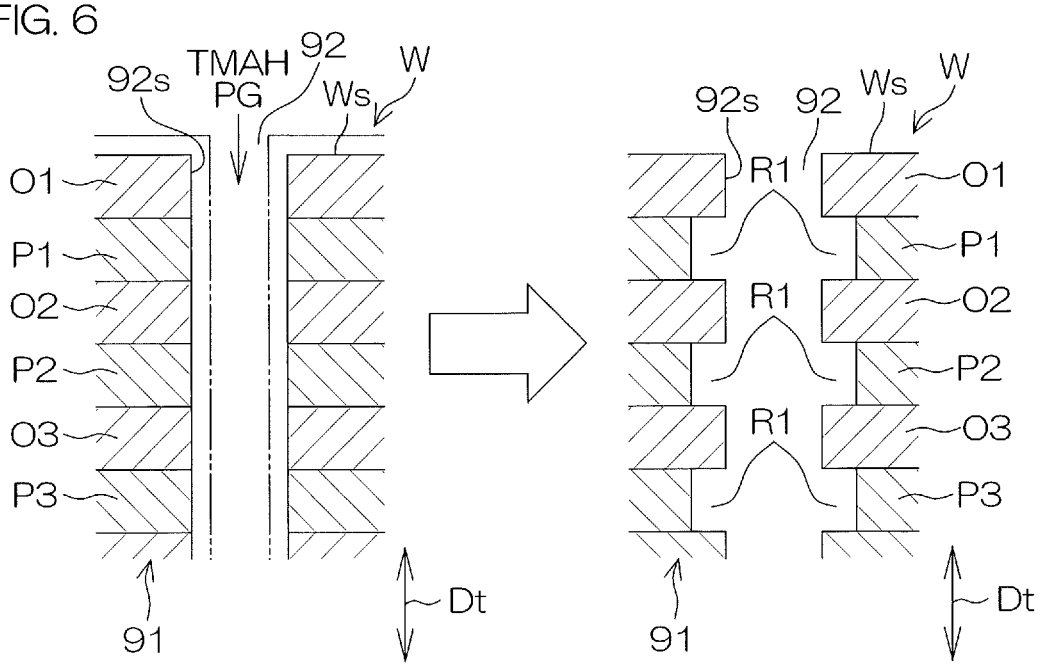
FIG. 6 a schematic view showing an example of the cross section of the substrate before and after the processing shown in FIG. 7 is executed.
Figure 7:
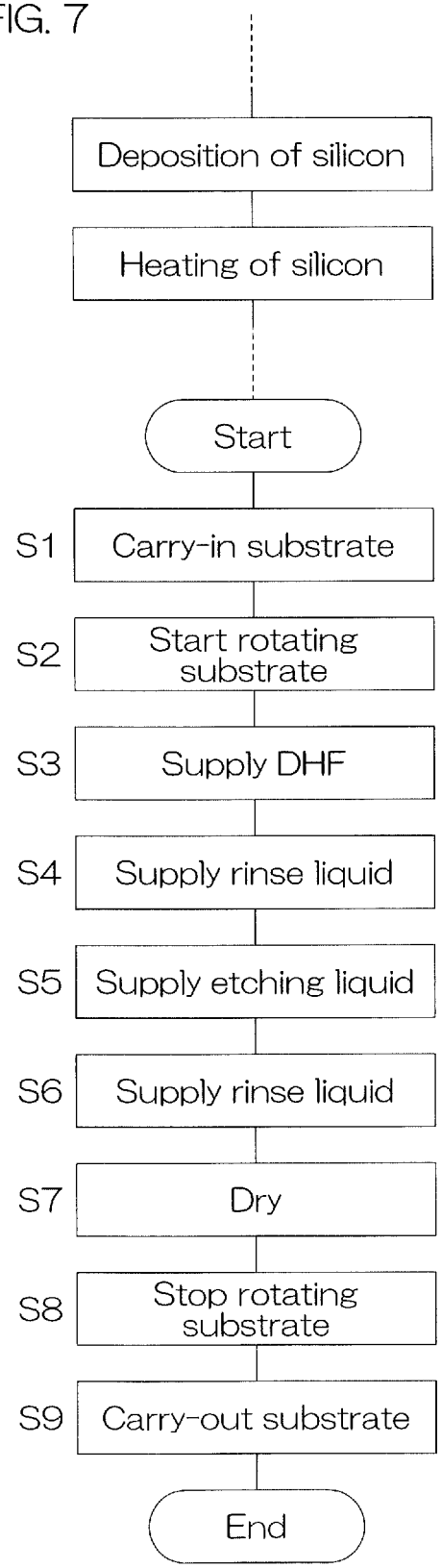
FIG. 7 a process chart for describing an example of the processing of the substrate which is executed by the substrate processing apparatus.

FIG. 6 is a schematic view showing an example of the cross section of the substrate W before and after the processing shown in FIG. 7 is executed.

The left side of FIG. 6 shows a cross-section of the substrate W before the processing shown in FIG. 7 (etching) is executed and the right side of FIG. 6 shows a cross-section of the substrate W after the processing shown in FIG. 7 (etching) is executed. As shown in the right side of FIG. 6, when the substrate W is etched, a plurality of recesses R1 recessed in a planar direction of the substrate W (a direction perpendicular to a thickness direction Dt of the substrate W) are formed on side surfaces 92s of a concave portion 92.

As shown in FIG. 6, the substrate W includes a laminated film 91 formed on a base material such as a silicon wafer and the like, and the concave portion 92 recessed in the thickness direction Dt of the substrate W (a direction perpendicular to the surface of the base material of the substrate) from the outermost surface Ws of the substrate W. The laminated film 91 includes a plurality of polysilicon films P1, P2, P3 and a plurality of silicon oxide films O1, O2, O3. The polysilicon films P1 to P3 are examples of the etching object, the silicon oxide films O1 to O3 are examples of a non-etching object. Silicon oxide is a substance that does not dissolve or hardly dissolve in the alkaline etching liquid including the quaternary ammonium hydroxide.

The plurality of the polysilicon films P1 to P3 and the plurality of the silicon oxide films O1 to O3 are laminated in the thickness direction Dt of the substrate W such that the polysilicon films and the silicon oxide films are alternated. The polysilicon films P1 to P3 are thin films for which a deposition step of depositing polysilicon on the substrate W and a heat treatment step of heating the deposited polysilicon are executed (refer to FIG. 7). The polysilicon films P1 to P3 may be thin films for which the heat treatment step is not executed.

As shown in FIG. 6, the concave portion 92 penetrates the plurality of the polysilicon films P1 to P3 and the plurality of the silicon oxide films O1 to O3 in the thickness direction Dt of the substrate W. The side surfaces of the polysilicon films P1 to P3 and the silicon oxide films O1 to O3 are exposed at the side surface 92s of the concave portion 92. The concave portion 92 may be any of a trench, a via hole and a contact hole, or may be other than these.

Natural oxide films exist on the surface layers of the polysilicon films P1 to P3 and the silicon oxide films O1 to O3 before the processing (etching) shown in FIG. 71 is started. Alternate long and two short dashes line in the left side of FIG. 6 represents outlines of the natural oxide films. The following describes the processing in which the natural oxide films of the polysilicon films P1 to P3 and the silicon oxide films O1 to O3 are removed by the supply of DHF which is an example of the oxide film removing liquid, and thereafter the polysilicon films P1 to P3 are selectively etched by the supply of the etching liquid.

FIG. 7 is a process chart for describing an example of the processing of the substrate W which is executed by the substrate processing apparatus 1.

The following describes an example of the processing of the substrate W executed by the substrate processing apparatus 1, referring to FIG. 1A, FIG. 2, FIG. 3 and FIG. 7. Steps after start in FIG. 7 are executed in the substrate processing apparatus 1.

When the substrate W is processed by the substrate processing apparatus 1, a carry-in step of carrying the substrate W into the chamber 4 is performed (step S1 in FIG. 7).

Specifically, in a state where the raising/lowering frame 32 and the shielding member 33 are positioned in the upper position and where all the guards 25 are positioned in the lower position, the center robot CR causes the hand H1 to enter the chamber 4 while supporting the substrate W with the hand H1. Then, the center robot CR places, on the chuck pins 11, the substrate W on the hand H1 with the front surface of the substrate W directed upward. Thereafter, the chuck pins 11 are pressed onto the outer circumferential surface of the substrate W, and thus the substrate W is grasped. The center robot CR places the substrate W on the spin chuck 10 and thereafter retracts the hand H1 from the interior of the chamber 4.

Then, the upper gas valve 57 and the lower gas valve 21 are opened, and thus the upper central opening 38 of the shielding member 33 and the lower central opening 18 of the spin base 12 start the discharge of the nitrogen gas. Thus, the oxygen concentration in the atmosphere in contact with the substrate W is reduced. Furthermore, the shielding member raising/lowering unit 31 lowers the raising/lowering frame 32 from the upper position to the lower position, and the guard raising/lowering unit 27 raises any one of the guards 25 from the lower position to the upper position. Here, the spin base 12 is held at such a reference rotational angle where the upper support portions 43 respectively overlap the lower support portions 44 in plan view. Thus, the upper support portions 43 of the shielding member 33 are supported on the lower support portions 44 of the spin base 12, and the shielding member 33 is separated from the raising/lowering frame 32. Thereafter, the spin motor 14 is driven to start the rotation of the substrate W (step S2 in FIG. 7).

Then, a first chemical liquid supplying step of supplying DHF as an example of the first chemical liquid to the upper surface of the substrate W is performed (step S3 in FIG. 7).

Specifically, in a state where the shielding member 33 is positioned in the lower position, the first chemical liquid valve 51 is opened, and thus the center nozzle 45 starts the discharge of the DHF. The DHF discharged from the center nozzle 45 hits the central portion of the upper surface of the substrate W and thereafter flows outward along the upper surface of the substrate W which is being rotated. Thus, a liquid film of the DHF which covers the entire region of the upper surface of the substrate W is formed, and the DHF is supplied to the entire region of the upper surface of the substrate W. When a predetermined time elapses after the opening of the first chemical liquid valve 51, the first chemical liquid valve 51 is closed, and the discharge of the DHF is stopped.

Then, a first rinse liquid supplying step of supplying pure water as an example of the rinse liquid to the upper surface of the substrate W is performed (step S4 in FIG. 7).

Specifically, in a state where the shielding member 33 is positioned in the lower position, the upper rinse liquid valve 55 is opened, and thus the center nozzle 45 starts the discharge of the pure water. The pure water which hit the central portion of the upper surface of the substrate W flows outward along the upper surface of the substrate W that is being rotated. The DHF on the substrate W is rinsed off by the pure water discharged from the center nozzle 45. Thus, a liquid film of the pure water which covers the entire region of the upper surface of the substrate W is formed. When a predetermined time elapses after the opening of the upper rinse liquid valve 55, the upper rinse liquid valve 55 is closed, and the discharge of the pure water is stopped.

Then, a second chemical liquid supplying step of supplying the etching liquid as an example of the second chemical liquid to the upper surface of the substrate W is performed (step S5 in FIG. 7).

Specifically, in a state where the shielding member 33 is positioned in the lower position, the second chemical liquid valve 53 is opened, and thus the center nozzle 45 starts the discharge of the etching liquid. Before the start of the discharge of the etching liquid, in order to switch the guards 25 which receive the liquid discharged from the substrate W, the guard raising/lowering unit 27 may vertically move at least one of the guards 25. The etching liquid which hit the central portion of the upper surface of the substrate W flows outward along the upper surface of the substrate W that is being rotated. The pure water on the substrate W is replaced by the etching liquid discharged from the center nozzle 45. Thus, a liquid film of the etching liquid which covers the entire region of the upper surface of the substrate W is formed. When a predetermined time elapses after the opening of the second chemical liquid valve 53, the second chemical liquid valve 53 is closed, and the discharge of the etching liquid is stopped.

Then, a second rinse liquid supplying step of supplying pure water as an example of the rinse liquid to the upper surface of the substrate W is performed (step S6 in FIG. 7).

Specifically, in the state where the shielding member 33 is positioned in the lower position, the upper rinse liquid valve 55 is opened, and thus the center nozzle 45 starts the discharge of the pure water. The pure water which hit the central portion of the upper surface of the substrate W flows outward along the upper surface of the substrate W that is being rotated. The etching liquid on the substrate W is rinsed off by the pure water discharged from the center nozzle 45. Thus, a liquid film of the pure water which covers the entire region of the upper surface of the substrate W is formed. When a predetermined time elapses after the opening of the upper rinse liquid valve 55, the upper rinse liquid valve 55 is closed, and the discharge of the pure water is stopped.

Then, a drying step of drying the substrate W by the rotation of the substrate W is performed (step S7 in FIG. 7).

Specifically, in the state where the shielding member 33 is positioned in the lower position, the spin motor 14 accelerates the substrate W in the rotation direction so as to rotate the substrate W at a high rotational speed (for example, several thousands of rpm) higher than the rotational speed of the substrate W in a period from the first chemical liquid supplying step to the second rinse liquid supplying step. Thus, the liquid is removed from the substrate W, and thus the substrate W is dried. When a predetermined time elapses after the start of the high-speed rotation of the substrate W, the spin motor 14 stops the rotation. Here, the spin motor 14 stops the spin base 12 at the reference rotational angle. Thus, the rotation of the substrate W is stopped (step S8 in FIG. 7).

Then, a carry-out step of carrying the substrate W out from the chamber 4 is performed (step S9 in FIG. 7).

Specifically, the shielding member raising/lowering unit 31 raises the raising/lowering frame 32 to the upper position, and the guard raising/lowering unit 27 lowers all the guards 25 to the lower position. Furthermore, the upper gas valve 57 and the lower gas valve 21 are closed, and thus the upper central opening 38 of the shielding member 33 and the lower central opening 18 of the spin base 12 stop the discharge of the nitrogen gas. Thereafter, the center robot CR causes the hand H1 to enter the chamber 4. After the chuck pins 11 release the grasping of the substrate W, the center robot CR supports the substrate W on the spin chuck 10 with the hand H1. Thereafter, the center robot CR retracts the hand H1 from the interior of the chamber 4 while supporting the substrate W with the hand H1. Thus, the processed substrate W is carried out from the chamber 4.

Figure 8A:
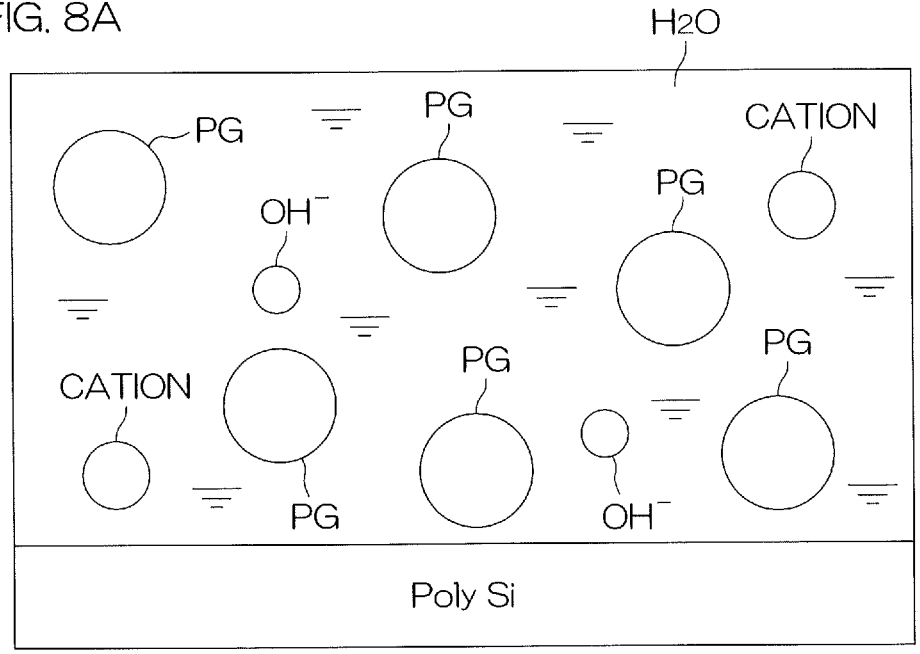
FIG. 8A a view for explaining an assumed mechanism in which an inhibitor inhibits the contact between hydroxide ion and polysilicon.
Figure 8B:
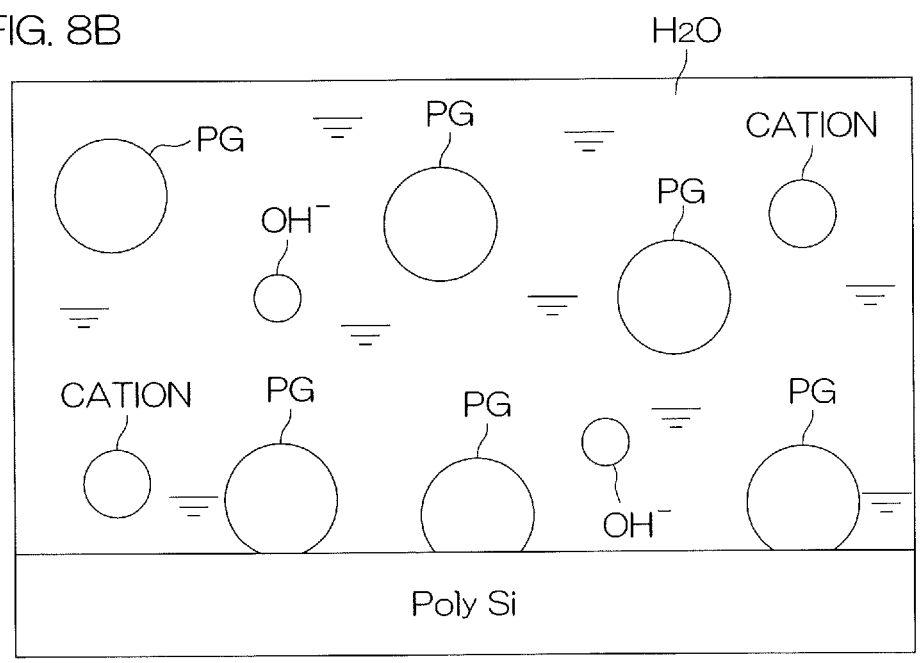
FIG. 8B a view for explaining the assumed mechanism in which the inhibitor inhibits the contact between hydroxide ion and polysilicon.

FIG. 8A and FIG. 8B are views for explaining an assumed mechanism in which the inhibitor inhibits the contact between hydroxide ion and polysilicon. FIG. 8A and FIG. 8B show an example where the inhibitor is propylene glycol.

When the quaternary ammonium hydroxide dissolves in water, the quaternary ammonium hydroxide separates into a positive ion (a cation) and a hydroxide ion ($OH^-$). Silicon contained in polysilicon reacts with hydroxide ion as represented by the formula "$Si+4OH^- \rightarrow Si(OH)_4+4e^-$." Thus, the silicon contained in the polysilicon dissolves in the etching liquid and etching of the polysilicon, which is the etching object, progresses.

In a case where the inhibitor is included in the etching liquid, the inhibitor is a steric obstacle for hydroxide ions and the movement of the hydroxide ion toward the polysilicon is blocked by the inhibitor drifting in the etching liquid or adsorbed or coordinated to the polysilicon. Thus, the number of hydroxide ions that reach the polysilicon decreases and the etching speed of the polysilicon lowers. It is thought that by such a mechanism the contact between the hydroxide ion and the polysilicon is inhibited by the inhibitor.

The decrease in etching speed occurs in a plurality of crystal planes of a silicon single crystal contained in the polysilicon, but the etching speed decreases relatively greatly at a crystal plane among a plurality of crystal planes of a silicon single crystal at which the etching speed is high. Thus, the difference in the etching speed among the plurality of crystal planes decreases and anisotropy of silicon single crystal with respect to the etching liquid lowers. That is, the polysilicon is uniformly etched regardless of plane directions of silicon single crystals exposed at the surface of the polysilicon. It is thought that by such a mechanism the polysilicon is etched with a uniform etching amount at every position.

FIG. 9 is a graph showing an example of the relationship between the etching speeds of the three crystal planes of silicon single crystal and the concentration of propylene glycol in the etching liquid.

FIG. 9 shows measured values of the etching speed of (110) plane, (100) plane, and (111) plane when a silicon single crystal is etched using three types of TMAH with different concentrations of propylene glycol (zero concentration, first concentration, second concentration). Etching conditions when the measured values shown in FIG. 9 are obtained are the same except for the concentration of propylene glycol in TMAH. For example, the temperature of TMAH is 40 degrees Celsius and the concentration of TMAH without propylene glycol added is 5 wt % (percent concentration of mass). The dissolved oxygen concentration of TMAH has been reduced in advance.

As shown in FIG. 9, in a case where the concentration of propylene glycol is zero, the etching speed of (110) plane is the largest and the etching speed of (111) plane is the smallest. As can be seen from the three curves shown in FIG. 9, when propylene glycol is added, the etching speeds decrease. Furthermore, in each crystal plane, the etching speed decreases as the concentration of propylene glycol increases.

However, in the range where the concentration of propylene glycol is 0 to the first concentration, the etching speeds of (110) and (100) planes decrease sharply, whereas the etching speed of (111) plane decrease very slowly. Thus, in this range, the difference between the maximum value of the etching speed and the minimum value of the etching speed decreases as the concentration of propylene glycol increases.

When the concentration of propylene glycol exceeds the first concentration, although the decreasing rate of the etching speed (the ratio of the absolute value of the amount of change in the etching speed to the absolute value of the amount of change in the concentration of propylene glycol) decreases, up to a value near the middle between the first concentration and the second concentration, the decreasing rates of the etching speeds of (110) plane and (100) plane are larger than the decreasing rate of the etching speed of (111) plane. Thus, even in the range where the concentration of propylene glycol is up to a value near the middle between the first concentration and the second concentration, the difference between the maximum value of the etching speed and the minimum value of the etching speed decreases as the concentration of propylene glycol increases.

As described above, when propylene glycol is added to TMAH that shows anisotropy to silicon single crystal, the plane direction selectivity, that is, the difference between the maximum value of the etching speed and the minimum value of the etching speed decreases and anisotropy of silicon single crystal to TMAH lowers. On the other hand, in the range where the concentration of propylene glycol is up to a value near the middle between the first concentration and the second concentration, the etching speeds of (110) plane and (100) plane decreases at a large decreasing rate as the concentration of propylene glycol increases. Thus, the concentration of propylene glycol may be set in accordance with the required etching uniformity and etching speed.

For example, the inhibitor such as propylene glycol may be administered excessively to the etching liquid. According to the measured result shown in FIG. 9, the effect of the relief of anisotropy is relatively small when propylene glycol is added at a small amount (for example, about 5 to 10 wt %), but the remarkable effect of the relief of anisotropy is recognized when propylene glycol is added at a large amount (for example, 20 wt % or more), that is, propylene glycol is administered excessively.

The remarkable effect of the relief of anisotropy is obtained by the excess administration of propylene glycol, but there is a disadvantage that the etching rate decreases, so that how much to excessively administer propylene glycol may be determined from the balance of the requirement of the relief of anisotropy and the requirement of throughput.

For example, the controller 3 may determine the concentration of the inhibitor in the etching liquid based on a target value of a difference of etching speeds of a plurality of crystal planes of a silicon single crystal constituting the polysilicon. The target value of the difference of etching speeds may be specified in the recipe or may be entered into the controller 3 from an external device such as the host computer.

As described above, in the embodiment, the alkaline etching liquid including the quaternary ammonium hydroxide, the water and the inhibitor is supplied to the substrate on which the etching objects P1 to P3 (refer to FIG. 6) and the non-etching objects O1 to O3 (refer to FIG. 6) different from the etching objects P1 to P3 are exposed. When the quaternary ammonium hydroxide dissolves in water, the quaternary ammonium hydroxide separates into a positive ion (a cation) and a hydroxide ion. The silicon single crystal included in the etching objects P1 to P3 reacts with the hydroxide ion and dissolves in the etching liquid. The etching speeds of the etching objects P1 to P3 are greater than the etching speeds of the non-etching objects O1 to O3. Thus, the etching objects P1 to P3 are selectively etched.

The inhibitor inhibits the contact between the hydroxide ion and the etching objects P1 to P3. That is, the inhibitor is a steric obstacle for hydroxide ions and reduces the number of hydroxide ions that react with the etching objects P1 to P3. Thus, the etching speeds of the etching objects P1 to P3 lowered. Furthermore, the etching speed does not decrease uniformly at a plurality of crystal planes of a silicon single crystal but decreases relatively greatly at a crystal plane among these at which the etching speed is high. Thus, the difference in the etching speed among the plurality of crystal planes decreases and anisotropy of silicon single crystal with respect to the etching liquid lowers. That is, the etching of silicon single crystal included in the etching objects P1 to P3 approaches isotropic etching and the etching objects P1 to P3 are etched with a uniform etching amount at every position.

As described above, the movement of the hydroxide ion in the etching liquid toward the polysilicon is blocked by the inhibitor drifting in the etching liquid or adsorbed or coordinated to the polysilicon. If the number of molecules of the inhibitors existing in the etching liquid is the same, the larger the molecule of the inhibitor, the harder it is for the hydroxide ion to reach the etching object P1 to P3. Like the embodiment, the number of the hydroxide ions that come into contact with the etching object t P1 to P3 can be efficiently reduced by using the inhibitor a molecule of which is larger than the hydroxide ion.

In the embodiment, the quaternary ammonium hydroxide, the water and the inhibitor are mixed not after being discharged from the discharge port 47, but before being discharged from the discharge port 47. Thus, the etching liquid in which the quaternary ammonium hydroxide, the water and the inhibitor are uniformly mixed is made. After that, the etching liquid is discharged toward the substrate W from the discharge port 47 and supplied to the substrate W. Thus, the substrate W can be uniformly processed as compared to a case of mixing the quaternary ammonium hydroxide, the water and the inhibitor after being discharged from the discharge port 47.

In the embodiment, DHF, which is an example of the oxide film removing liquid, is supplied to the substrate W and the natural oxide films of the etching objects P1 to P3 are removed from the surface layers of the etching objects P1 to P3. After that, the etching liquid is supplied to the substrate W and the etching objects P1 to P3 are selectively etched.

The natural oxide films of the etching objects P1 to P3 are mainly composed of silicon oxide. The etching liquid is liquid that etches the etching objects P1 to P3 and does not etch or hardly etches silicon oxide. This is because a hydroxide ion reacts with silicon, but does not react with or hardly reacts with silicon oxide. Thus, it is possible to effectively etch the etching objects P1 to P3 by removing the natural oxide films of the etching objects P1 to P3 in advance.

In the embodiment, the etching objects P1 to P3, for which the heat treatment step to heat the deposited polysilicon is executed, are etched by the alkaline etching liquid. When the deposited polysilicon is heated under an appropriate condition, the grain size of the polysilicon increases. Thus, as compared to a case where the heat treatment step is not executed, silicon single crystals included in the etching objects P1 to P3 increase in size. It means that the number of the silicon single crystals exposed on the surfaces of the etching objects P1 to P3 decreases and the influence of the anisotropy increases. Thus, it is possible to effectively lower the influence of the anisotropy by supplying such an etching object P1 to P3 with the etching liquid including the quaternary ammonium hydroxide, the water and the inhibitor.

In the embodiment, the dissolved oxygen concentration of at least one of the quaternary ammonium hydroxide, the water and the inhibitor is lowered. Thus, the dissolved oxygen concentration of the etching liquid made by these is lowered. When the etching liquid with the high dissolved oxygen concentration is supplied to the substrate W, portions of the surface layers of the etching objects P1 to P3 are oxidized and changed to silicon oxide. It means that the etching speeds of the etching objects P1 to P3 are further lowered. Thus, it is possible to lower anisotropy of silicon single crystal while reducing the decrease in the etching speeds of the etching objects P1 to P3 by supplying the substrate W with the etching liquid the dissolved oxygen concentration of which is low.

In the embodiment, the etching liquid is supplied to the substrate W in a state where the oxygen concentration in the atmosphere is low. Thus, the amount of the oxygen dissolved in the etching liquid from the atmosphere decreases and the rise in the dissolved oxygen concentration is reduced. When the etching liquid with the high dissolved oxygen concentration is supplied to the substrate W, the etching speeds of the etching objects P1 to P3 are further lowered. Thus, it is possible to reduce the further decrease in the etching speed by lowering the oxygen concentration in the atmosphere.

Next, the second embodiment will be described.

The second embodiment mainly differs from the first embodiment in that a substrate processing apparatus 101 is a batch type apparatus that processes a plurality of substrates W in a batch.

Figure 10:
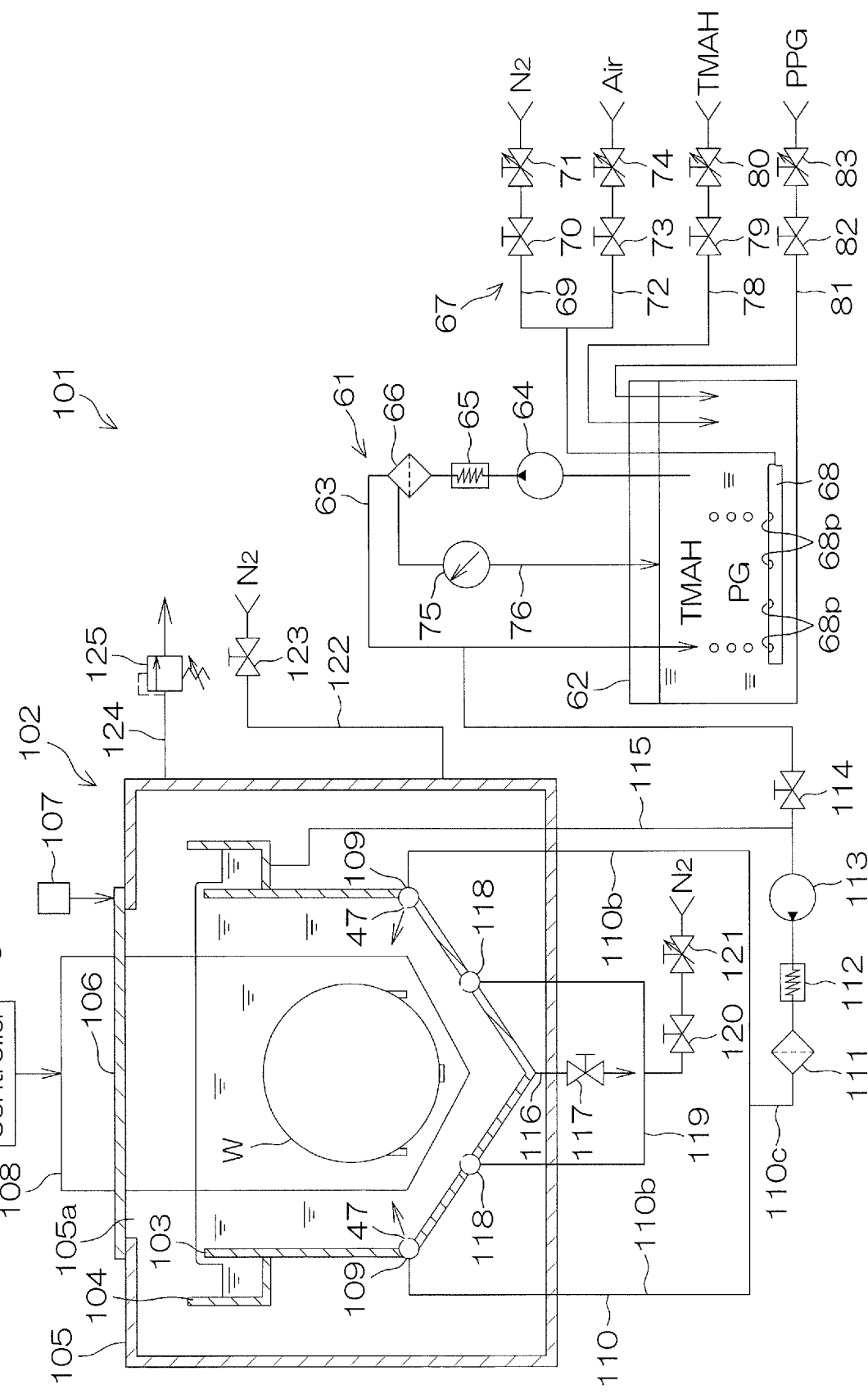
FIG. 10 a schematic view showing a chemical liquid processing unit included in a substrate processing apparatus according to a second embodiment of the present invention.
Figure 11:
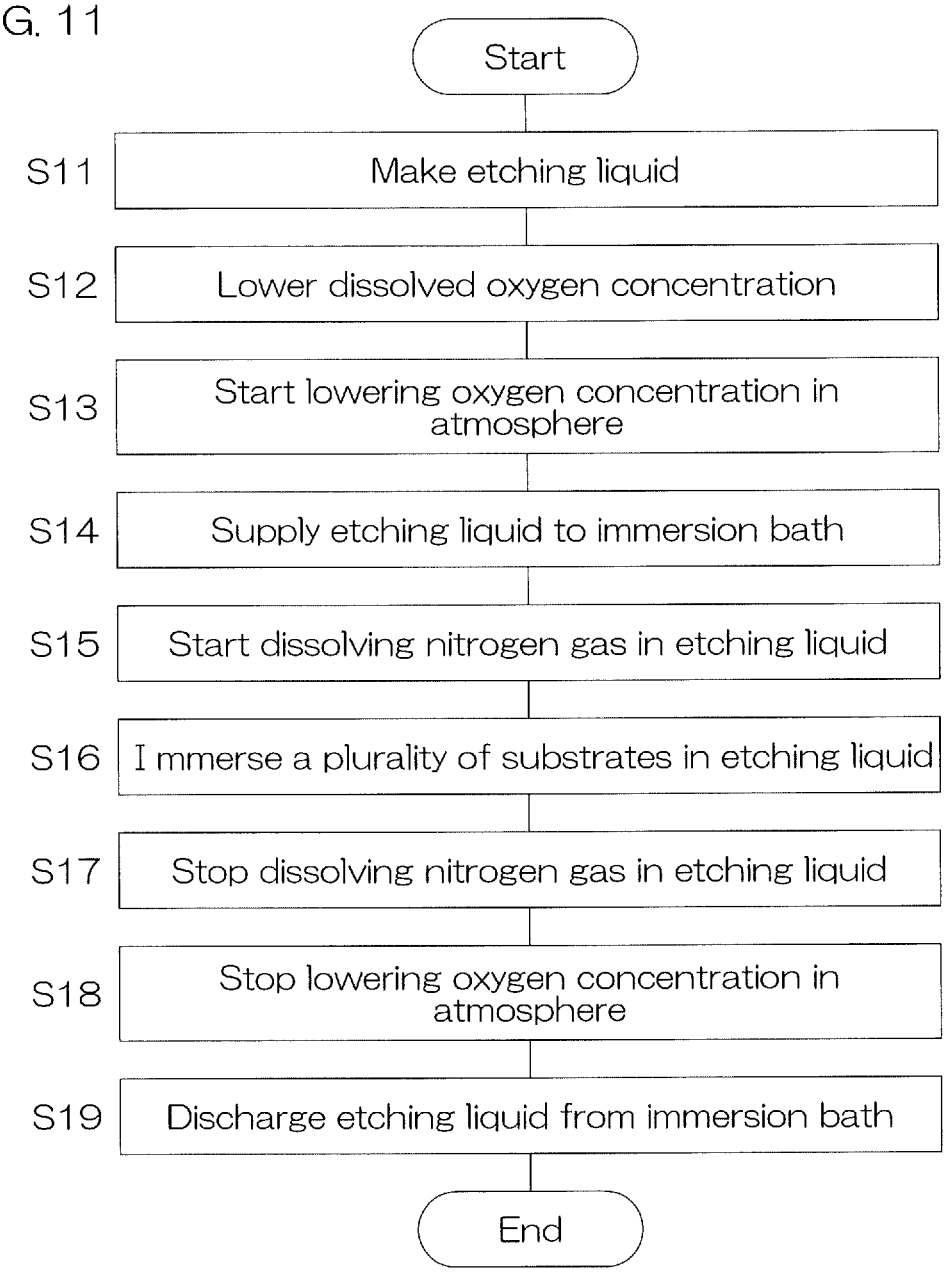
FIG. 11 a process chart showing an example of the flow to make a new etching liquid and discharge the used etching liquid from an immersion bath.

FIG. 10 is a schematic view showing a chemical liquid processing unit 102 included in a substrate processing apparatus 101 according to a second embodiment of the present invention. In FIG. 10 and FIG. 11, components equivalent to the components described above and shown in FIG. 1 to FIG. 9 are designated by the same reference characters as in FIG. 1, etc., and description thereof is omitted.

The substrate processing apparatus 101 includes a plurality of processing units that supply the processing liquid to a plurality of substrates W at the same time, a transfer unit that executes a carry-in operation to carry a plurality of substrates W into the processing unit at the same time and a carry-out operation to carry out a plurality of substrates W from the processing unit at the same time and a controller 3 that controls the substrate processing apparatus 101.

The plurality of processing units includes a chemical liquid processing unit 102 that supplies a plurality of substrates W with the alkaline etching liquid corresponding the second chemical liquid at the same time. The chemical liquid processing unit 102 includes an immersion bath 103 that stores the etching liquid and into which a plurality of substrates W are carried at the same time and an overflow bath 104 that receives the etching liquid overflowing from the immersion bath 103. Although not shown, the plurality of processing units further includes a rinse liquid processing unit that supplies a plurality of substrates W, to which the etching liquid has been supplied, with the rinse liquid at the same time and a dry processing unit that simultaneously dries a plurality of substrates W to which the rinse liquid has been supplied.

The chemical liquid processing unit 102 includes, in addition to the immersion bath 103 and the overflow bath 104, a housing 105 that houses the immersion bath 103 and the overflow bath 104, a shutter 106 that opens and closes a carry-in/carry-out port 105a provided in an upper portion of the housing 105 and an opening and closing unit 107 that moves the shutter 106 between a closed position where the carry-in/carry-out port 105a is closed by the shutter 106 and an opened position where the carry-in/carry-out port 105a is open. A plurality of substrates W pass up and down through the carry-in/carry-out port 105a. The transfer unit includes a lifter 108 that rises and falls between a lower position where a plurality of substrates W are immersed in the etching liquid within the immersion bath 103 and an upper position where the plurality of substrates W are located above the etching liquid within the immersion bath 103 while simultaneously holding the plurality of substrates W.

The chemical liquid processing unit 102 includes two chemical liquid nozzles 109 provided with the second chemical liquid discharge ports 47 to discharge the alkaline etching liquid corresponding the second chemical liquid, and discharged liquid piping 116 that discharges liquid in the immersion bath 103. When the chemical liquid nozzles 109 discharge the etching liquid, the etching liquid is supplied to the inside of the immersion bath 103, an upward flow is formed in the etching liquid within the immersion bath 103. Also, when a discharged liquid valve 117 interposed in the discharged liquid piping 116 is opened, the liquid in the immersion bath 103 such as the etching liquid is drained to the discharged liquid piping 116. An upstream end of the discharged liquid piping 116 is connected to a bottom portion of the immersion bath 10.

The circulation piping 63 that circulates the etching liquid in the tank 62 of the chemical liquid making unit 61 is connected to the two chemical liquid nozzles 109 via a chemical liquid piping 110. The chemical liquid piping 110 includes common piping 110c that guide the etching liquid supplied from the circulation piping 63 toward the two chemical liquid nozzles 109 and two branch pipes 110b that guides the etching liquid supplied from the common piping 110c to the two chemical liquid nozzles 109, respectively. Upstream ends of the branch pipes 110b are connected to the common piping 110c and downstream ends of the branch pipes 110b are connected to the chemical liquid nozzles 109.

When the empty immersion bath 103 is filled with the etching liquid, the chemical liquid valve 114 interposed in the common piping 110c is opened. Thus, the etching liquid in the common pipe 110c is supplied to the two chemical liquid nozzles 109 via the two branch pipes 110b, and is discharged from the two chemical liquid nozzles 109. Then, when the inside of the immersion bath 103 is filled with the etching liquid, the chemical liquid valve 114 is closed, and the supply of the etching liquid to the immersion bath 103 from the tank 62 is stopped. The chemical liquid valve 114 is closed except when the empty immersion tank 103 is filled with the etching liquid.

The overflow bath 104 is connected to the common piping 110c via return piping 115. An upstream end of the return piping 115 is connected to the overflow bath 104 and a downstream end of the return piping 115 is connected to the common piping 110c at a position downstream of the chemical liquid valve 114. The etching liquid that has overflowed from the immersion bath 103 to the overflow bath 104 is sent again by a pump 113 to the two chemical liquid nozzles 109 and filtered by a filter 111 before reaching the two chemical liquid nozzles 109. The chemical liquid processing unit 102 may include a temperature controller 112 that changes the temperature of the etching liquid in the immersion bath 103 by heating or cooling the etching liquid.

The dissolved oxygen concentration changing unit 67 that adjusts the dissolved oxygen concentration of the etching liquid further includes at least one of gas nozzle 118 that dissolves low oxygen gas, which has an oxygen concentration lower than an oxygen concentration in air (about 21 vol %), in the etching liquid in the immersion bath 103. FIG. 10 shows an example where two gas nozzles 118 are provided and the low oxygen gas is nitrogen gas. The two gas nozzles 118 are attached to the immersion bath 103 and discharge the nitrogen gas at the inside of the immersion bath 103.

The dissolved oxygen concentration changing unit 67 includes gas supplying piping 119 that supply nitrogen gas to the at least one of the gas nozzle 118, a gas valve 120 that opens and closes between an open state in which the nitrogen gas flows from the gas supplying piping 119 to the at least one of the gas nozzle 118 and a close state in which the nitrogen gas is stopped at the gas supplying piping 119 and a gas flow rate adjusting valve 121 that changes the flow rate of the nitrogen gas supplied from the gas supplying piping 119 to the at least one of the gas nozzle 118.

When the gas valve 120 is opened while the etching liquid is in the immersion bath 103, nitrogen gas is ejected from the two gas nozzles 118 at a flow rate corresponding to the degree of opening of the gas flow rate adjusting valve 121. Thus, a large number of bubbles are formed in the etching liquid within the immersion bath 103, and nitrogen gas dissolves in the etching liquid within the immersion bath 103. At this time, dissolved oxygen is discharged from the etching liquid, and the dissolved oxygen concentration of the etching liquid decreases. Thus, the rise in the dissolved oxygen concentration in the etching liquid in the immersion bath 103 is reduced.

The dissolved oxygen concentration changing unit 67 further includes purge gas supplying piping 122 that supply the low oxygen gas such as nitrogen gas to the inside of the housing 105 and a purge gas valve 123 that opens and closes between an open state in which the nitrogen gas flows from the purge gas supplying piping 122 to the housing 105 and a close state in which the nitrogen gas is stopped at the purge gas supplying piping 122. The dissolved oxygen concentration changing unit 67 further includes gas discharging piping 124 that guide gas inside the housing 105 to the outside of the housing 105 and a relief valve 125 that discharges gas inside the housing 105 through the gas discharging piping 124 when the air pressure inside the housing 105 exceeds the upper limit pressure.

When the shutter 106 is closed while the purge gas valve 123 is open, the amount of gas discharged through the carry-in/carry-out port 105a decreases, so the air pressure in the housing 105 rises. When the air pressure in the housing 105 exceeds the upper limit pressure, the relief valve 125 opens and the gas in the housing 105 is discharged to the gas discharging piping 124. Thus, air is expelled from the housing 105 and the housing 105 is filled with nitrogen gas. Therefore, the oxygen contained in the atmosphere inside the housing 105 that has dissolved in the etching liquid in the immersion bath 103 decreases, and the rise in the dissolved oxygen concentration is reduced.

FIG. 11 is a process chart showing an example of the flow to make a new etching liquid and discharge the used etching liquid from the immersion bath 103.

The operations described below are performed by the controller 3 controlling the substrate processing apparatus 101. In other words, the controller 3 is programmed to cause the substrate processing apparatus 101 to perform the following operations. Reference is hereinafter made to FIG. 10 and FIG. 11.

The etching liquid to be supplied to the immersion bath 103 of the chemical liquid processing unit 102 is made by the chemical liquid making unit 61 (step S11 of FIG. 11). Specifically, TMAH is supplied to the inside of the tank 62 from the hydroxide piping 78, and propylene glycol is supplied to the inside of the tank 62 from the inhibitor piping 81. Thus, TMAH and propylene glycol are mixed in the tank 62 and the etching liquid is made. Furthermore, inert gas such as nitrogen gas is supplied to the inside of the tank 62 from the gas supply piping 68. Thus, the dissolved oxygen concentration of the etching liquid in the tank 62 lowers (step S12 of FIG. 11).

When the making of the etching liquid is completed, the purge gas valve 123 is opened and supplying nitrogen gas to the housing 105 from the purge gas supplying piping 122 is started (step S13 of FIG. 11). Thus, the housing 105 is filled with the inert gas. After that, the chemical liquid valve 114 is opened, and supplying the etching liquid to the immersion bath 103 from the tank 62 is started (step S14 of FIG. 11). When the immersion bath 103 is filled with the etching liquid, the chemical liquid valve 114 is closed and supplying the etching liquid to the immersion bath 103 from the tank 62 is stopped. After that, the gas valve 120 is opened and the dissolution of nitrogen gas into the etching liquid in the immersion bath 103 is started (step S15 of FIG. 11). Thus, the rise in the dissolved oxygen concentration in the etching liquid in the immersion bath 103 is reduced.

After the discharge of nitrogen gas from the gas nozzle 118 is started, the lifter 108 descends from the upper position to the lower position while holding a plurality of substrates W. After that, the opening and closing unit 107 moves the shutter 106 from the opened position to the closed position. Thus, all the substrates W included in a batch are immersed in the etching liquid in the immersion bath 103 (step S16 of FIG. 11). Therefore, the etching liquid is simultaneously supplied to a plurality of substrates W and the etching object such as the polysilicon films P1 to P3 (refer to FIG. 6) is etched. When a predetermined time elapses after the lifter 108 moves to the lower position, the opening and closing unit 107 moves the shutter 106 to the opened position and the lifter 108 rises to the upper position.

In this way, all the substrates W included in a batch are immersed in the etching liquid in the immersion bath 103, and thereafter carried out from the immersion bath 103. This continuous flow is repeated for each batch. That is, when all the substrates W included in a batch are removed from the immersion bath 103, all the substrates W included in another batch are immersed in the etching liquid in the immersion bath 103 and etched as described above. Then, when the number of uses or the usage time of the etching liquid in the immersion bath 103 reaches the upper limit, the etching liquid in the immersion bath 103 is replaced with a new etching liquid.

Specifically, the gas valve 120 is closed and the dissolution of nitrogen gas into the etching liquid in the immersion bath 103 is stopped (step S17 of FIG. 11). Furthermore, the purge gas valve 123 is closed and the supply of nitrogen gas from the purge gas supplying piping 122 to the housing 105 is stopped (step S18 of FIG. 11). After that, the discharged liquid valve 117 is opened and the etching liquid in the immersion bath 103 is discharged into the discharged liquid piping 116 (step S19 of FIG. 11). When the immersion bath 103 is empty, a new pre-made the etching liquid is supplied to the immersion bath 103 (step S11 of FIG. 11 to step S14).

OTHER EMBODIMENTS

The present invention is not restricted to the contents of the embodiments described above and various modifications are possible.

For example, TMAH and propylene glycol may be mixed at a space between the discharge port 47 of the center nozzle 45 and the substrate W, or may be mixed at the substrate W. Alternatively, TMAH and propylene glycol may be mixed not at the inside of the tank 62 but at a position between the tank and the discharge port 47 of the center nozzle 45. Specifically, the inhibitor piping 81 that guide propylene glycol may be connected not to the tank 62 but to a path of the chemical liquid from the tank 62 to the discharge port 47 of the center nozzle 45.

Figure 12:
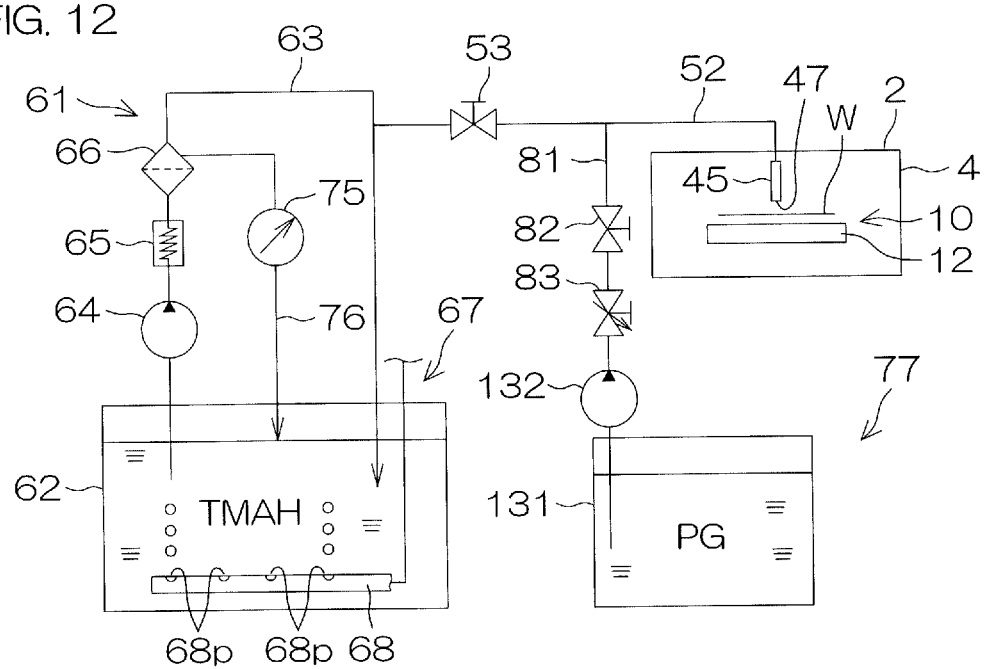
FIG. 12 a schematic view showing a chemical liquid making unit according to a third embodiment of the present invention.

FIG. 12 shows an example in which the inhibitor piping 81 is connected to the second chemical liquid piping 52. In the example shown in FIG. 12, TMAH is stored in the tank 62, and an aqueous solution of propylene glycol is stored in a tank 131. The inhibitor piping 81 may be connected to the center nozzle 45. A liquid of propylene glycol may be stored in the tank 131 instead of an aqueous solution of propylene glycol.

When the inhibitor piping 81 is connected to either the second chemical liquid piping 52 or the center nozzle 45, propylene glycol in the tank 131 is sent by a pump 132 from the tank 131 to the inhibitor piping 81 and mixed with TMAH at the inside of the second chemical liquid piping 52 or the inside of the center nozzle 45. Thus, the alkaline etching liquid including TMAH, propylene glycol and water is discharged from the discharge port 47 of the center nozzle 45.

The alkaline etching liquid including TMAH and propylene glycol may be supplied not to the upper surface of the substrate W but to the lower surface of the substrate W. Alternatively, the etching liquid may be supplied to both the upper surface and the lower surface of the substrate W. In these cases, the lower surface nozzle 15 may discharge the etching liquid.

The dissolved oxygen concentration changing unit 67 may be omitted from the substrate processing apparatus. That is, the etching liquid the dissolved oxygen concentration of which is not lowered may be supplied to the substrate W.

The tubular portion 37 may be omitted from the shielding member 33. The upper support portions 43 and the lower support portions 44 may be omitted from the shielding member 33 and spin chuck 10.

The shielding member 33 may be omitted from the processing unit 2. In this case, the processing unit 2 may include a nozzle that discharges the processing liquid such as the first chemical liquid toward the substrate W. The nozzle may be a scan nozzle that is horizontally movable in the chamber 4, or may be a fixed nozzle that is fixed with respect to the partition wall 6 of the chamber 4. The nozzle may include a plurality of liquid discharge ports that supply the processing liquid to the upper surface or the lower surface of the substrate W by simultaneously discharging the processing liquid toward a plurality of positions away in the radial direction of the substrate W. In this case, at least one of the flow rate, the temperature and the concentration of the processing liquid to be discharged may be changed for each of the liquid discharge ports.

The number of the polysilicon films included in the laminated film 91 may be one. Similarly, the number of the silicon oxide films included in the laminated film 91 may be one.

In a case where the silicon oxide film is formed on the polysilicon film, the concave portion 92 may penetrate only the silicon oxide film in the thickness direction Dt of the substrate W. That is, the surface of the polysilicon film may be a bottom surface of the concave portion 92. In this case, a plurality of concave portions 92 may be provided in the substrate W.

The non-etching object may be a substance other than silicon oxide.

The substrate processing apparatus may be a batch type apparatus that processes a plurality of substrates at once.

Two or more arrangements among all the arrangements described above may be combined. Two or more steps among all the steps described above may be combined.

Various other design changes are possible within the scope of the matters described in the claims.

The chemical liquid making unit 61 is an example of an etching liquid making means and an etching liquid maker. The center nozzle 45 is an example of a selective etching means and a selective etching nozzle. The second chemical liquid discharge port 47 is an example of a discharge port. The second chemical liquid piping 52, the tank 62, the hydroxide piping 78, and the inhibitor piping 81 are an example of a mixing means and a mixer. The center nozzle 45, particularly the first chemical liquid discharge port 46 is an example of a natural oxide film removing means and a natural oxide film remover. The dissolved oxygen concentration changing unit 67 is an example of a dissolved oxygen concentration changing means and a dissolved oxygen concentration changer. The lower gas valve 21, the lower gas flow rate adjusting valve 22, the upper gas valve 57, and the upper gas flow rate adjusting valve 58 are an example of an atmosphere oxygen concentration changing means and an atmosphere oxygen concentration changer.

The embodiments of the present invention are described in detail above, however, these are just detailed examples used for clarifying the technical contents of the present invention, and the present invention should not be limitedly interpreted to these detailed examples, and the spirit and scope of the present invention should be limited only by the claims appended hereto.

REFERENCE SIGNS LIST

1: Substrate processing apparatus
15: Lower surface nozzle
18: Lower central opening
21: Lower gas valve
22: Lower gas flow rate adjusting valve
45: Center nozzle 46: First chemical liquid discharge port
47: Second chemical liquid discharge port
49: Upper gas discharge port
52: Second chemical liquid piping
57: Upper gas valve
58: Upper gas flow rate adjusting valve
61: Chemical liquid making unit
62: Tank
67: Dissolved oxygen concentration changing unit
78: Hydroxide piping
81: Inhibitor piping
91: Laminated film
92: Concave portion
101: Substrate processing apparatus
109: Chemical liquid nozzle
118: Gas nozzle
O1 to O3: Silicon oxide film
P1 to P3: Polysilicon film
W: Substrate

What is claimed is:

1. A substrate processing method to supply an alkaline etching liquid to a substrate on which an etching object including polysilicon and a non-etching object different from the etching object are exposed, the substrate processing method comprising:
    an etching liquid making step of making the alkaline etching liquid including quaternary ammonium hydroxide, water and inhibitor that inhibits contact of a hydroxide ion generated from the quaternary ammonium hydroxide and the etching object; and
    a selective etching step of etching the etching object while inhibiting etching of the non-etching object by supplying the etching liquid made in the etching liquid making step to the substrate on which the etching object and the non-etching object are exposed, wherein
    the etching liquid making step includes a concentration determining step of determining concentration of the inhibitor in the etching liquid based on a target value of a difference of etching speeds of a plurality of crystal planes of a silicon single crystal constituting the polysilicon.

2. The substrate processing method according to claim 1, wherein the concentration of the inhibitor in the etching liquid made in the etching liquid making step is 20 percent concentration of mass or more, and less 100 percent concentration of mass.

3. The substrate processing method according to claim 1, wherein a molecule of the inhibitor is larger than the hydroxide ion.

4. The substrate processing method according to claim 1, wherein
    the etching liquid making step includes a pre-discharge mixing step of mixing the quaternary ammonium hydroxide, the water and the inhibitor before the etching liquid is discharged from a discharge port, and
    the selective etching step includes a discharging step of causing the discharge port to discharge the etching liquid made in the etching liquid making step toward the substrate.

5. The substrate processing method according to claim 1, further comprising a natural oxide film removing step of supplying an oxide film removing liquid to the substrate and removing a natural oxide film of the etching object before the selectively etching step.

6. The substrate processing method according to claim 1, wherein the etching object is a thin film obtained by performing a plurality of steps including a deposition step of depositing the polysilicon and a heat treatment step of heating the polysilicon deposited in the deposition step.

7. The substrate processing method according to claim 1, wherein the etching liquid making step includes a dissolved oxygen concentration changing step of lowering dissolved oxygen concentration of at least one of the quaternary ammonium hydroxide, the water and the inhibitor.

8. The substrate processing method according to claim 1, further comprising an atmosphere oxygen concentration changing step of lowering oxygen concentration in an atmosphere that is in contact with the etching liquid held by the substrate.

9. The substrate processing method according to claim 1, wherein the inhibitor is glycol.

10. The substrate processing method according to claim 9, wherein the etching liquid making step is a step of making the alkaline etching liquid including TMAH (tetramethylammonium hydroxide) as the quaternary ammonium hydroxide, the water and propylene glycol as the glycol.

* * * * *